(12) United States Patent
Yasuda et al.

(10) Patent No.: US 9,276,540 B2
(45) Date of Patent: *Mar. 1, 2016

(54) DIGITAL/ANALOGUE CONVERSION APPARATUS

(71) Applicant: TRIGENCE SEMICONDUCTOR, INC., Tokyo (JP)

(72) Inventors: Akira Yasuda, Tokyo (JP); Junichi Okamura, Tokyo (JP)

(73) Assignee: TRIGENCE SEMICONDUCTORS, INC., Tokyo (JP)

( * ) Notice: Subject to any disclaimer, the term of this patent is extended or adjusted under 35 U.S.C. 154(b) by 409 days.

This patent is subject to a terminal disclaimer.

(21) Appl. No.: 13/763,083

(22) Filed: Feb. 8, 2013

(65) Prior Publication Data

US 2013/0156231 A1 Jun. 20, 2013

Related U.S. Application Data

(63) Continuation of application No. 12/285,323, filed on Oct. 1, 2008, now Pat. No. 8,423,165, which is a continuation of application No. PCT/JP2007/060072, filed on May 16, 2007.

(30) Foreign Application Priority Data

May 21, 2006 (JP) .................................. 2006-140975
Oct. 11, 2006 (JP) .................................. 2006-277476

(51) Int. Cl.
*G06F 17/00* (2006.01)
*H04R 3/00* (2006.01)
(Continued)

(52) U.S. Cl.
CPC ................ *H03G 3/20* (2013.01); *H03H 15/00* (2013.01); *H03M 3/344* (2013.01); *H03M 3/414* (2013.01); *H03M 3/504* (2013.01); *H03M 7/3022* (2013.01); *H04R 1/005* (2013.01); *H04R 3/00* (2013.01)

(58) Field of Classification Search
CPC ........... G11B 20/10527; G11B 27/105; G11B 2020/10546; G06F 3/16; H04R 3/00; H04R 3/04; H04R 3/08; H04R 1/005; H04R 9/06
USPC ............ 700/94; 341/143, 144; 381/120, 71.1, 381/95, 111, 116, 117; 330/10, 251, 207 A
See application file for complete search history.

(56) References Cited

U.S. PATENT DOCUMENTS

| | | | |
|---|---|---|---|
| 4,555,797 A | 11/1985 | Nieuwendijk et al. |
| 4,566,120 A | 1/1986 | Nieuwendijk et al. |

(Continued)

FOREIGN PATENT DOCUMENTS

| | | |
|---|---|---|
| CN | 1204895 | 1/1999 |
| CN | 1615588 | 5/2005 |

(Continued)

OTHER PUBLICATIONS

"Piezo-Electric Type Digital Loudspeaker and Dynamic Responses as Digital-to-Analog Converter", The Transactions of the Institute of Electronics, Information and Communication Engineers. A, Vol.72, No. 11(Nov. 1989) pp. 1724-1732.

(Continued)

*Primary Examiner* — Xu Mei
(74) *Attorney, Agent, or Firm* — Typha IP LLC

(57) ABSTRACT

A digital/analog conversion apparatus to convert a digital signal into an analog signal. The digital/analog conversion apparatus can generate a high-quality analog signal, even when elements configuring the digital/analog conversion apparatus have variance, with high resolution and a small circuit size. The data conversion apparatus is provided with a first data converter to reduce the number of bits of an input signal, a second data converter to convert the format of the first output signal, and a third data converter for conversion into a code which corresponds to the history of the output from the second data converter.

12 Claims, 31 Drawing Sheets

(51) Int. Cl.
*H03G 3/20* (2006.01)
*H03H 15/00* (2006.01)
*H03M 3/00* (2006.01)
*H04R 1/00* (2006.01)
*H03M 7/30* (2006.01)

(56) References Cited

U.S. PATENT DOCUMENTS

| | | |
|---|---|---|
| 5,347,587 A | 9/1994 | Takahashi et al. |
| 5,404,142 A | 4/1995 | Adams et al. |
| 5,530,750 A | 6/1996 | Akagiri |
| 5,592,559 A | 1/1997 | Takahashi et al. |
| 5,856,799 A | 1/1999 | Hamasaki et al. |
| 5,862,237 A | 1/1999 | Kishigami et al. |
| 5,872,532 A | 2/1999 | Yasuda |
| 5,909,496 A | 6/1999 | Kishigami et al. |
| 5,982,317 A | 11/1999 | Steensgaard-Madsen |
| 6,160,894 A | 12/2000 | Kishigami et al. |
| 6,292,124 B1 | 9/2001 | Hanada et al. |
| 6,476,752 B1 | 11/2002 | Eastty et al. |
| 6,563,448 B1 | 5/2003 | Fontaine |
| 6,571,823 B2 | 6/2003 | Rossi et al. |
| 6,694,028 B1 | 2/2004 | Matsuo |
| 6,697,004 B1 | 2/2004 | Galton et al. |
| 6,807,281 B1 | 10/2004 | Sasaki et al. |
| 6,930,625 B1 | 8/2005 | Lin |
| 6,940,436 B2 | 9/2005 | Hezar et al. |
| 7,058,463 B1 | 6/2006 | Ruha et al. |
| 7,081,793 B2 | 7/2006 | Morris et al. |
| 7,089,069 B2 | 8/2006 | Gabriel et al. |
| 7,091,893 B2 | 8/2006 | Seknicka |
| 7,098,828 B2 | 8/2006 | San et al. |
| 7,336,794 B2 | 2/2008 | Furst et al. |
| 7,439,440 B2 | 10/2008 | Hsu |
| 7,492,297 B2 | 2/2009 | Lin |
| 7,696,816 B2 | 4/2010 | Bates |
| 7,710,300 B2 | 5/2010 | Kwan |
| 7,792,311 B1 | 9/2010 | Holmgren et al. |
| 7,825,986 B2 | 11/2010 | Chung |
| 7,889,109 B2 | 2/2011 | Murahashi |
| 8,098,718 B2 | 1/2012 | Sienko et al. |
| 8,306,244 B2* | 11/2012 | Okamura et al. ............. 381/111 |
| 8,423,165 B2* | 4/2013 | Yasuda et al. .................. 700/94 |
| 8,577,483 B2 | 11/2013 | Oh et al. |
| 8,620,005 B2 | 12/2013 | Ma et al. |
| 2001/0022556 A1 | 9/2001 | Masuda |
| 2002/0084925 A1 | 7/2002 | Dedic et al. |
| 2003/0018790 A1 | 1/2003 | Nonaka |
| 2003/0122692 A1 | 7/2003 | Roeckner et al. |
| 2003/0123678 A1 | 7/2003 | Kemmerer et al. |
| 2003/0123681 A1 | 7/2003 | Furst et al. |
| 2003/0156051 A1 | 8/2003 | Brooks et al. |
| 2003/0179891 A1 | 9/2003 | Rabinowitz et al. |
| 2004/0008859 A1 | 1/2004 | Zhao |
| 2004/0017304 A1 | 1/2004 | Heizmann et al. |
| 2004/0032355 A1 | 2/2004 | Melanson |
| 2004/0124915 A1 | 7/2004 | Heubi et al. |
| 2005/0012545 A1 | 1/2005 | Mallinson |
| 2005/0031151 A1 | 2/2005 | Melillo |
| 2005/0075744 A1 | 4/2005 | Reefman et al. |
| 2005/0089182 A1 | 4/2005 | Troughton et al. |
| 2005/0122244 A1 | 6/2005 | Hongoh et al. |
| 2005/0168365 A1* | 8/2005 | Kaplan ................ 341/143 |
| 2005/0264586 A1 | 12/2005 | Kim |
| 2006/0007027 A1 | 1/2006 | Ishizuka et al. |
| 2006/0013413 A1 | 1/2006 | Sakaidani |
| 2006/0049889 A1 | 3/2006 | Hooley |
| 2006/0149401 A1 | 7/2006 | Chung |
| 2006/0149402 A1 | 7/2006 | Chung |
| 2006/0176203 A1 | 8/2006 | Grosso et al. |
| 2006/0192703 A1 | 8/2006 | Yen |
| 2006/0290550 A1 | 12/2006 | Lee |
| 2007/0121968 A1 | 5/2007 | Na |
| 2008/0186218 A1 | 8/2008 | Ohkuri et al. |
| 2008/0219474 A1 | 9/2008 | Deruginsky et al. |
| 2009/0110217 A1 | 4/2009 | Yasuda et al. |
| 2009/0243905 A1 | 10/2009 | Redmayne et al. |
| 2009/0296954 A1 | 12/2009 | Hooley et al. |
| 2010/0008521 A1 | 1/2010 | Cohen et al. |
| 2010/0245142 A1 | 9/2010 | Myles et al. |
| 2011/0051954 A1 | 3/2011 | Thomsen et al. |
| 2011/0150244 A1 | 6/2011 | Lin et al. |
| 2012/0033837 A1 | 2/2012 | Mitsui et al. |
| 2012/0099740 A1 | 4/2012 | Ma et al. |
| 2013/0156231 A1 | 6/2013 | Yasuda et al. |
| 2014/0029763 A1 | 1/2014 | Takada et al. |

FOREIGN PATENT DOCUMENTS

| | | |
|---|---|---|
| CN | 1636420 | 7/2005 |
| CN | 1702710 | 11/2005 |
| CN | 101242678 | 8/2008 |
| CN | 101542909 | 9/2009 |
| CN | 101986721 A | 3/2011 |
| CN | 1972525 B | 12/2011 |
| CN | 101242678 B | 1/2012 |
| CN | 102422650 A | 4/2012 |
| CN | 101257729 B | 3/2013 |
| CN | 103167380 A | 6/2013 |
| EP | 0712549 B1 | 11/2000 |
| JP | S56-48698 A | 5/1981 |
| JP | 57-3498 | 1/1982 |
| JP | 57-138293 | 8/1982 |
| JP | 58-127795 | 8/1983 |
| JP | 2-121497 | 5/1990 |
| JP | H03-066297 A | 3/1991 |
| JP | 3-216025 | 9/1991 |
| JP | 04-355599 | 12/1992 |
| JP | 11-502981 | 3/1993 |
| JP | 5-145988 | 6/1993 |
| JP | 5-176387 | 7/1993 |
| JP | H05-199575 A | 8/1993 |
| JP | 06-335082 | 2/1994 |
| JP | 7-131881 | 5/1995 |
| JP | 8-65791 | 3/1996 |
| JP | 8-154058 | 6/1996 |
| JP | 08-154058 | 6/1996 |
| JP | 09-046787 | 2/1997 |
| JP | 09-501287 | 2/1997 |
| JP | 9-501287 | 2/1997 |
| JP | 09-186601 | 7/1997 |
| JP | 10-013986 | 1/1998 |
| JP | H10-051888 A | 2/1998 |
| JP | 10-276490 | 10/1998 |
| JP | 11-112245 | 4/1999 |
| JP | 11-122110 | 4/1999 |
| JP | 11-262084 | 9/1999 |
| JP | 2000-78015 | 3/2000 |
| JP | 2000-228630 | 8/2000 |
| JP | 2000-269761 | 9/2000 |
| JP | 2000-295049 | 10/2000 |
| JP | 2000-341129 | 12/2000 |
| JP | 2001-36409 | 2/2001 |
| JP | 2002-504277 | 2/2002 |
| JP | 2002-216026 A | 8/2002 |
| JP | 2002-374170 | 12/2002 |
| JP | 2003-513502 | 4/2003 |
| JP | 2003-216163 | 7/2003 |
| JP | 2003-324788 | 11/2003 |
| JP | 2003-338758 A | 11/2003 |
| JP | 2004-222251 A | 8/2004 |
| JP | 2005-338763 | 12/2005 |
| JP | 2006-19988 | 1/2006 |
| JP | 2006-067008 A | 3/2006 |
| JP | 2006-109275 | 4/2006 |
| JP | 2006-303618 | 11/2006 |
| JP | 2006-338763 | 12/2006 |
| JP | 2006-339852 A | 12/2006 |
| JP | 2008-67041 | 3/2008 |
| JP | 2008-193160 A | 8/2008 |
| JP | 2009-147928 | 7/2009 |
| JP | 2009-538553 | 11/2009 |
| JP | 2010-263332 | 11/2010 |
| JP | 2012-227589 | 11/2012 |

(56) References Cited

FOREIGN PATENT DOCUMENTS

| JP | 2013-157972 | 8/2013 |
|---|---|---|
| JP | 2013-543715 | 12/2013 |
| WO | 95/05034 | 2/1995 |
| WO | WO 95/05034 | 2/1995 |
| WO | 96/31086 | 10/1996 |
| WO | 01/31793 A1 | 5/2001 |
| WO | 03/071827 A2 | 8/2003 |
| WO | 2004-040770 A | 5/2004 |
| WO | 2007/135928 | 11/2007 |
| WO | 2007135928 | 11/2007 |

OTHER PUBLICATIONS

"Possibility of Multi-Bits in PiezoElectric Type Digital Loudspeaker with Compound Driving System", The Transactions of the Institute of Electronics, Information and Thmmunication Engineers. A, vol. 74, No. 6 (Jun. 1991) pp. 913-915.
"Piezo-Electric Type Loudspeaker Driven by 16 bits Digital Signal and Its Acoustic Responses", The Transactions of the Institute of Electronics, Information and Communication Engineers. A, Vol.J76-A, No. 9(19930925) pp. 1392-1395.
"Digital-driven piezoelectric speaker using multi-bit delta-sigma modulation", The 121$^{st}$ Convention of Audio Engineering Society, 2006 Oct. 5-8, pp. 1-6.
Office Action dated Jan. 9, 2013 issued in copending U.S. Appl. No. 12/929,070.
Restriction Requirement dated Oct. 2, 2012 issued in copending U.S. Appl. No. 12/929,070.
Office Action dated Feb. 6, 2012 issued in copending U.S. Appl. No. 12/659,813.
Notice of Allowance dated Jul. 9, 2012 issued in copending U.S. Appl. No. 12/659,813.
Restriction Requirement dates Dec. 27, 2011 issued in copending U.S. Appl. No. 12/659,813.
Pieter Rombouts et al. "A Study of Dynamic Element-Matching Techniques for 3-Level Unit Elements" IEEE Transactions on Circuits and Systems-11:Analog and Digital Signal Processing, Vo. 47, No. 11, Nov. 2000; pp. 1177-1187.
Oversampling Delta-Sigma Dataconverters, pp. 1-25. Sep. 2, 1991.
DAC Architectures for Improved Linearity, pp. 251-259. Oct. 14, 1996.
Tsuyoshi Soga, et al., "A Direct Digital Driving Speaker", Symposium of Autumn 2005 of Acoustic Society of Japan, Sep. 20, 2005, pp. 585-586.
Ichiro Fujimori, et al., "A Multibit Delta-Sigma Audio DAC with 120-dB Dynamic Range", IEEE Journal of Solid-State Circuits, Aug. 2000, vol. 35, No. 8, pp. 1066-1073.
Masanori Shibata, et al., "A Cascaded Delta-Sigma DAC with an analog FIR filter reducing mismatch-effects", Circuits and Systems, 48th Midwest Symposium, Aug. 2005, vol. 2, pp. 1263-1266.
Japanese Office Action issued Nov. 9, 2010 in corresponding Japanese Patent Application 2008-516630.
Japanese Office Action issued Nov. 9, 2010 in corresponding Japanese Patent Application 2008-310147.
Japanese Office Action issued Mar. 16, 2010 in corresponding Japanese Patent Application 2008-516630.
Japanese Office Action issued May 11,2010 in corresponding Japanese Patent Application 2008-310147.
"A Digitally Direct Driven Small Loud Speaker", The 13th Regional Convention of Audio Engineering Society, Jul. 19-21, 2007, pp. 1-6.
"A Digitally Direct Driven Dynamic-type Loudspeaker", The 124th Convention of Audio Engineering Society, May 17-20, 2008, pp. 1-8.
Notice of Allowance dated Nov. 8, 2012 issued in copending U.S. Appl. No. 12/285,323.
Office Action dated May 8, 2012 issued in copending U.S. Appl. No. 12/285,323.
Office Action dated Dec. 20, 2011 issued in copending U.S. Appl. No. 12/285,323.
Office Action dated Jul. 15, 2012 issued in copending U.S. Appl. No. 12/285,323.

Office Action issued in a related U.S. Appl. No. 13/221,335 dated Jan. 13, 2014.
Japanese Office Action dated Mar. 3, 2015 in corresponding Japanese Patent Application No. 2014-081167.
Korean Office Action dated Apr. 1, 2015 in corresponding Korean Patent Application No. 10-2010-7005223.
Chinese Office Action dated Mar. 9, 2015 in corresponding Chinese Patent Application No. 201080001918.8.
Japanese Notice of Allowance dated Apr. 14, 2015 in corresponding Japanese Patent Application No. 2014-115496.
U.S. Office Action dated Apr. 28, 2015 in co-pending U.S. Appl. No. 13/221,335.
U.S. Office Action dated Apr. 1, 2015 in co-pending U.S. Appl. No. 13/665,320.
Japanese Office Action issued Jul. 15, 2014 in Japanese Patent Application No. 2013-229250.
Japanese Office Action issued Jul. 15, 2014 in Japanese Patent Application No. 2011-510758.
Chinese Office Action issued May 6, 2014 in Chinese Patent Application No. 201080029610.4.
U.S. Office Action issued Jul. 14, 2014 in corresponding U.S. Appl. No. 13/221,335.
U.S. Office Action issued Jul. 22, 2014 in corresponding U.S. Appl. No. 13/552,270.
European Office Action issued Jul. 22, 2014 in corresponding European Patent Application No. 10788219.3.
Chinese Office Action issued Jun. 23, 2014 in corresponding Chinese Patent Application No. 201080001918.8.
The extended European search report of EP10788219.3, which is an EP counterpart of the present application, issued on Jul. 31, 2013.
Office Action issued in a related Japanese Patent Application No. 2008-314438 on Aug. 20, 2013.
Office Action issued in a related Japanese Patent Application No. 2008-314929 on Aug. 20, 2013.
Office Action issued in a related Japanese Patent Application No. 2011-510759 on Sep. 10, 2013.
Extended European Search Report mailed Dec. 11, 2013 in corresponding European Application No. 10835733.6.
U.S. Office Action dated Sep. 24, 2014 in co-pending U.S. Appl. No. 12/929,070.
Chinese Office Action dated Nov. 15, 2014 in corresponding Chinese Patent Application No. 201080029610.4.
Chinese Office Action dated Dec. 3, 2014 in corresponding Chinese Patent Application No. 201210087070.6.
Extended European Search Report dated Nov. 4, 2014 in corresponding European Patent Application No. 09766515.2.
Office Action dated Aug. 26, 2015 regarding a corresponding Chinese Patent Application No. 201210549780.6.
Office Action mailed Sep. 8, 2015 regarding a corresponding Japanese Patent Application No. 2014-185599.
U.S. Notice of Allowance dated Jul. 23, 2015 in co-pending U.S. Appl. No. 13/665,320.
U.S. Notice of Allowance dated Jul. 16, 2015 in co-pending U.S. Appl. No. 13/221,335.
Japanese Office Action dated Jan. 20, 2015 in corresponding Japanese Patent Application No. 2011-510758.
Search Report of Chinese Notice of Allowance dated Jan. 8, 2015 in corresponding Chinese Patent Application No. 201210086644.8.
Chinese Office Action dated Dec. 3, 2014 in corresponding Chinese Patent Application No. 201210549780.6.
Japanese Notice of Allowance dated Feb. 17, 2015 in corresponding Japanese Patent Application No. 2014-098585.
Japanese Office Action dated Feb. 3, 2015 in corresponding Japanese Patent Application No. 2014-115496.
Search Report of Chinese Notice of Allowance dated Feb. 2, 2015 in corresponding Chinese Patent Application No. 201210086679.1.
European Summons to Attend Oral Proceedings dated Feb. 9, 2015 in corresponding European Patent Application No. 10788219.3.
Partial English Translation of Japanese Patent Application No. 57-3498, Reference AE in the IDS filed on Sep. 22, 2014.
Office Action dated Sep. 14, 2015 regarding a corresponding Chinese Patent Application No. 201280001918.8.

(56) References Cited

OTHER PUBLICATIONS

Office Action dated Oct. 7, 2015 regarding a co-pending U.S. Appl. No. 14/722,780.

Office Action dated Oct. 13, 2015 regarding a corresponding Korean Patent Application No. 10-2010-7005223.

Office Action dated on Dec. 1, 2015, by JPO, regarding Japanese Patent Application No. 2015-054483.

Japanese Office Action issued on Oct. 27, 2015, by Japanese Patent Office regarding Japanese Patent Application No. 2014-211709.

The minutes of the oral proceedings of EP10788219.3 dated on Nov. 30, 2015, regarding the European counterpart of the current application.

The decision to refuse a European Patent Application of EP10788219.3 dated on Nov. 30, 2015, regarding the European counterpart of the current application.

Office Action issued on Dec. 4, 2015 by Korean Patent Office regarding the corresponding Korean patent application of No. 10-2010-7027958.

* cited by examiner

DIGITAL/ANALOGUE CONVERSION APPARATUS

CROSS-REFERENCE TO RELATED APPLICATIONS

This application is a U.S. continuation application filed under 37 USC 1.53 claiming priority benefit of U.S. Ser. No. 12/285,323 filed in the United States on Oct. 1, 2008, which is based upon and claims the benefit of priority to U.S. continuation application filed under 35 USC 111(a) claiming benefit under 35 USC 120 and 365(c) of PCT application JP2007/060072, filed on May 16, 2007, which claims priority to Japanese Application Nos. 2006-140975 and 2006-277476, respectively filed May 21, 2006 and Oct. 11, 2006, the entire contents of the foregoing applications being incorporated herein by reference.

BACKGROUND OF THE INVENTION

1. Field of the Invention

Embodiments relate to a digital/analogue conversion apparatus which converts a digital signal into an analog signal and also relates to applications using the same.

2. Description of the Related Art

U.S. Pat. Nos. 5,862,237 and 5,909,496 propose conventional examples of digital/analogue conversion apparatus which convert a digital signal into an analogue signal and applications which use the same where such a digital/analogue conversion apparatus coverts an audio signal into a plurality of digital signals and the audio signal is reproduced by using a plurality of speaker driver devices.

FIG. 1 of U.S. Pat. No. 5,862,237 shows that a digital serial audio signal is once converted into a plurality of digital signals using a serial-parallel converter and a decoder circuit. Here, the characteristic of this example is that the plurality of digital signals are converted so that they are weighted by the amplitude of the audio signal. In this way, a system is proposed which reproduces audio according to the amplitude of the audio signal when a plurality of speakers are driven by controlling the amount of current of an electric current supply of a plurality of driving devices in accordance with such weighting and driving the plurality of speakers.

FIG. 4 of U.S. Pat. No. 5,909,496 shows a digital serial audio signal is once converted into a plurality of digital signals using a serial-parallel converter and a decoder circuit as disclosed in U.S. Pat. No. 5,862,237. Here, the characteristic of this example is that the plurality of digital signals are converted so that they are weighted by the amplitude of the audio signal and the direction of the current of the drive circuits which drive the plurality of speakers is controlled using a specific single bit (MSB is a known example) among the plurality of digital signals. In this way, in addition to reproducing audio according to the amplitude of the audio signal when a plurality of speakers are driven by controlling the amount of current of an electric current supply of a plurality of driving devices in accordance with this weighting and driving the plurality of speakers, the drive circuits can be comprised by a simpler circuit.

In these conventional examples, because the serial-parallel converted signals are used as they are unadjusted as signals for driving a plurality of circuits the following problems occur: firstly, the manufacturing nonuniformity among current power sources of weighted drive circuits becomes a cause of non-linear noise, and second, when reproducing a digital signal the quantization noise which is generated during reproducing digital signals is superimposed as a noise component in an audible frequency band. Therefore, these examples suffer from difficulty in reproducing high definition audio signals.

In order to avoid the first problem a means is necessary for reducing the manufacturing nonuniformity among several drive devices.

In U.S. Pat. No. 5,872,532, a technology is proposed consisting of a selection circuit and an integrator for controlling the selection circuit as a means for reducing the nonuniformity between current supply sources which drive a plurality of speaker drive devices. According to this proposal, a signal which drives the plurality of speakers is input to a selection device and by controlling by a circuit which integrates once or more whether the plurality of speaker drive circuits have been used or not, the usage frequency of each of the plurality of speaker drive devices is integrated so that this integration result is maintained at a constant without depending on an input signal and the selection circuit is controlled. As a result, it becomes possible to reduce noise caused by the manufacturing nonuniformity among drive devices. Furthermore, the technology by which the nonuniformity among a plurality of drive devices is reduced is called a miss match shaping method.

FIG. 1 of U.S. Pat. No. 5,592,559 shows that an input serial audio signal is digitally modulated once using a sigma delta modulator and audio is reproduced by driving voice coils. While this conventional example proposes that a speaker in which two voice coils are driven in the positive and the negative directions using a three-valued signal which has been digitally modulated, technology for driving a plurality of two or more voice coils or reducing variation among a plurality of drive devices is not mentioned.

FIG. 3 of U.S. Pat. No. 7,058,463 demonstrates a proposal in which an input audio serial audio signal is digitally modulated once using a sigma delta modulator and over sampling and the output signal is pushed out to a higher frequency than an audible frequency band. Such technology in which a quantization noise is pushed out outside a certain frequency band in this way is called a noise shaping. In this conventional example, the quantization noise which occurs when reproducing a digital signal shifts to a frequency band higher than the audible frequency band using the noise-shaping method. Using this method the second problem in which the quantization noise is superimposed as a noise component of the audible frequency band is avoided.

Also, in order to avoid the first problem in which noise is generated due to the manufacturing nonuniformity among several drive devices, this conventional example proposes to introduce a miss-match shaping method which uses a selection circuit which is controlled by a DEM method (Dynamic Element Matching) using a pseudorandom signal.

However, a problem remains because even though a speaker drive circuit is driven without attenuating the quantization noise which is pushed out to a frequency higher than the audible frequency band by a digitally modulation using a sigma delta modulator and over sampling, the quantization noise which shifts to a higher frequency band is emitted from the speaker.

In addition, by simply switching the selection circuit by a DEM method using a random signal, white noise which is caused by such random signal is superimposed on to the audio signal which is reproduced. In order to avoid the problem of the noise caused by the manufacturing nonuniformity among several drive circuits, it is necessary to operate the switching of the selection circuit by the DEM method at a higher speed in addition to increasing the number of speaker drive circuits. The operation by the DEM method is given in detail in reference document "Delta-Sigma Converters" IEEE Press 1997 ISBN 0-7803-1045-4, section 8.3.3 and FIG. 8.5. The need for a high speed operation in a selection circuit is an serious weakness in the miss match shaping method which uses the DEM method. Furthermore, this weakness has already been pointed out in U.S. Pat. No. 5,872,532 and is widely known.

Pushing out the quantization noise which is generated by reproducing a digital signal to a frequency band above the audible frequency band by using a noise shaping method by digital modulation using a sigma delta modulator and over sampling is a technology which is generally well known. The relationship between the strength of noise which is shaped and the over sampling rate under a modulator order is shown in the formula in the reference document "Over sampling Delta-Sigma Data Converters" IEEE Press 1991 ISBN 0-87942-285-8, pp. 7 (22). Generally, in the noise shaping method, the effective strength of the quantization noise falls by 3 (2L+1) dB every time the over sampling rate is doubled where L is given as an order of a delta sigma converter. Therefore, in order to reduce quantization noise the over sampling rate must be increased or the order of the delta sigma modulator must be increased. On the other hand, when the over sampling rate is increased, it becomes necessary to operate the delta sigma modulator at a higher speed. In addition, when the order of the delta sigma modulator is increased the operation of the delta sigma modulator becomes unstable.

As stated above, in the noise shaping method in which a digital modulation is performed using a delta sigma modulation circuit and over sampling, the quantization noise which is generated by reproducing a digital signal is pushed out to a frequency band above the audible frequency band. Therefore, it is necessary to attenuate by a continuous time low pass filter (LPF) the unnecessary shaped quantization noise which is generated by the delta sigma modulation circuit or a component outside of the audible frequency band FIG. 1(a) shows an example of a general system using a delta sigma modulation circuit. The unnecessary quantization noise or out-of-band component which is shaped and generated by a delta sigma modulator (100) is attenuated by a continuous LPF (101). Because over sampling is performed a low order LPF is enough. However, when a pass-band is narrow the decay time constant becomes larger and it becomes impossible to ignore the space occupied by the LPF mounted in a semiconductor integrated device.

There is a method for turning a delta sigma modulator into a multi-bit delta sigma modulator (110) as shown in FIG. 1(b) as a method for relaxing the required characteristics of the LPF which is placed after a modulator. In this case, by increasing the number of bits of the delta sigma modulator by one bit, it is possible to reduce quantization noise by 6 dB and therefore it becomes possible to relax the cutoff frequency characteristics of the LPF. However, by making a modulator into a multi-bit modulator, the circuit scale of an internal modulator increases significantly.

As another method for relaxing the required characteristics of an LPF, a method is proposed in which a Switched Capacitor Filter (121) shown in FIG. 1 (c) is placed between the delta sigma modulator and the LPF. In this case, because a large capacitor is often required to reduce a cutoff frequency in addition to an OP amp in order to realize the Switched Capacitor Filter, this method suffers from a significant increase in chip area and consumption of power.

As another method for relaxing the required characteristics of an LPF, a method is proposed in which an analogue FIR filter (131) shown in FIG. 1(d) is placed between the delta sigma modulator and the LPF. In this method, the analog FIR filter is formed by analogically calculating and outputting each tap of the FIR filter. In this case, by increasing the number of taps, it is possible to increase the amount of attenuation of the out-of-band noise. This method which uses an analog FIR filter also has the effect of reducing deterioration in SNR by a clock jitter and is an effective method when using a clock signal with low accuracy or when using several clocks in the same chip.

Nevertheless, when a delta sigma modulator is turned into a multi-bit modulator, because only a delay element which forms an analog FIR filter and because the number of bits of the delta sigma modulator is required to be the number of cells of a segment type modulator multiplied by the number of taps, the circuit scale increases dramatically.

BRIEF SUMMARY OF THE INVENTION

The operations in a method which places an analog FIR filter after a system which utilizes a general noise shaping method using a delta sigma modulation circuit, particularly in the case where a cascade type delta sigma modulator is used, is further explained in detail below.

First, FIG. 2 shows a general composition of a cascade type delta sigma modulator (200). A digital signal input (210) is quantized by a delta sigma modulator (201) in a first stage and quantization noise of the first stage (211) is further quantized in a delta sigma modulator (202) of the second stage. After an output $Y_2$ in the second stage is converted by a digital signal process block (220), the first stage output is added (230) to $Y_1$ and output.

Let $Y_1$ be the output of the first stage and $Y_2$ be the output of the second stage, $NTF_1(z)$ be the noise transfer function of the first stage, $NTF_2(z)$ be the second stage noise transfer function, $Q_1$ be the first stage quantization noise, $Q_2$ be the second stage quantization noise, $A_1$ be the gain from the first stage to the second stage, and $H_3 = NTF_1(z)/A_1$, then the entire output Y becomes:

$$Y = Y_1 + Y_2 H_3 = Y_1 + Y_2 NTF_1/A_1 \qquad \text{(expression one)}$$
$$= X + NTF_1 Q_1 + (-A_1 Q_1 + NTF_2 Q_2) NTF1/A_1$$
$$= X + NTF_1 Q_1 - NTF_1 Q_1 + NTF_1 NTF_2 Q_2/A_1$$
$$= X + NTF_1 NTF_2 Q_2/A_1$$

and it is possible to cancel out the quantization noise in the first stage.

FIG. 3 shows a general structure (300) of the analog FIR filter which is placed after this cascade type delta sigma modulator.

This structure can also be modified to a structure (400) in which the analog FIR filter is placed after each stage of the cascade type delta sigma converter as shown in FIG. 4. As shown in FIG. 4, the operation of the second stage in the case where the analog FIR filter is placed after each stage of the cascade type delta sigma modulator is explained in detail below.

After a signal from $Y_2$ is multiplied with $H_3(z)$ by the digital signal process block (220), the transfer function $H_{FIR}(Z)$ of the FIR filter (300) is multiplied.

Consider the case when the first stage is a first order delta sigma modulator and the FIR filter is a moving average filter. When the transfer function of the FIR filter is assumed to be $H_3(z) = NTF_1 = (1-z^{-1})$:

when $H_{FIR}(z) = 1 + z^{-1} + z^{-2} \ldots + z^{-(n-1)}$ (expression two)

then $H_3 H_{FIR} = (1 - z^{-1})(1 + z^{-1} + z^{-2} \ldots + z^{-(n-1)})$ (expression three)

$= 1 - z^{-n}$ and it becomes possible to use a post filter of two taps regardless of the number of FIR filter taps. In other words, in the case where an analog FIR filter is placed after a cascade type delta sigma modulator, by constructing the structure shown in FIG. 4 the number of taps of the second stage post filter is constantly two and even if the number of the FIR filter taps is increased, the number of post filter taps does not increase which is suitable for miniaturization.

Similarly, consider the case when the first stage is a first order delta sigma modulator and the FIR filter is a moving average filter. Because $H_3=NTF_1=(1-z^{-1})^2$, $H_3 H_{FIR} = (1 - z^{-1})^2 (1 + z^{-1} + z^{-2} \ldots + z^{-(n-1)})$ (expression four)

$= 1 - z^{-1} - z^{-n} + z^{-(n+1)}$ and the number of second stage post filter taps becomes four regardless of the length of a FIR filter tap.

In other words, in the case where an analog FIR filter is placed after a cascade type delta sigma modulator, by constructing the structure shown in FIG. 4, even if the number of FIR filter taps is increased, it becomes possible to prevent an increase in the number of the second stage post filter taps regardless of the order of the delta sigma modulator, which is viewed as being suitable for miniaturization.

Furthermore, $Y_{FIR}$ in the case where an analog FIR filter is placed after a cascade type delta sigma modulator becomes:

$Y_{FIR}=(1+z^{-1}+z^{-2} \ldots +z^{-(n-1)})(X+NTF_1 NTF_2 Q_2/A_1)$ (expression five)

FIG. 5 shows a general block diagram as explained above, in the case where an analog FIR filter is placed after a later stage of a modulator in each stage of a cascade type delta sigma modulator. Here, for the purposes of explanation, the number of FIR filter taps is n, a noise transfer function of the first stage of the cascade type delta sigma modulator is $NTF=(1-z^{-1})^2$, and the first stage is comprised of a single bit internal modulator and the second stage is comprised of an n bit internal modulator.

Here, a digital input signal (510) is input to the internal modulator (201) of the first stage of the cascade type delta sigma modulator, the second internal modulator (202) is connected to the first stage internal modulator (201) using a cascade connection and an output signal (520) output from the first stage internal modulator (201) is input to the analog FIR filter (301). The output signal (530) output from the second stage internal modulator (202) is converted from a binary code into a thermometer code by a formatter circuit (501). The signal (531) converted into the thermometer code is input into a post filer circuit (502). The output signal (521) output from the analog FIR filter (301) and the output signal (532) output from the post filter circuit (502) are analogically added by an adder circuit (540) and output.

An effect in the case where a tap coefficient which forms an analog FIR filter in the cascade type delta sigma modulator which uses the analog FIR filter contains errors is considered below.

In the case where the first stage internal modulator is of a single bit, a mismatch corresponds to the tap coefficient errors and the frequency characteristics of an analog FIR filter is affected. However, because there is no effect on the linearity from the digital input to the analog output, there is no deterioration in output distortion characteristics or SNR.

On the other hand, in the case where the first stage internal modulator is constituted to be of three levels or more, as is the case in a general delta sigma modulator a mismatch of an analog FIR filter part affects an output and because the distortion or SNR characteristics deteriorate, a separate mismatch shaper is required in the case where the number of levels of the first stage internal modulator is increased.

While a mismatch of the elements which form the second stage post filter also affects an output, because the second stage output signal is the first stage quantization noise, SNR deteriorates but as long as there is no signal component is included there is no deterioration in distortion characteristics.

Here, a calculation of the effects of the analog FIR filter and the post filter tap coefficient upon the output $Y_{FIR}$ is demonstrated below.

Here, in the case where both the first stage and second stage internal modulators are of two level and $NTF_1=NTF_2=(1-z^{-1})^2$, assuming that the characteristics of the analog FIR filter is $H_{1FIR}$, the characteristics of the post filter is $H_{2FiR}$, the first stage tap coefficient of each is $a_0, a_1, \ldots, a_{n-1}$, and the second stage tap coefficient is $b_0, b_1, \ldots, b_n$, then the output $Y_{FIR}$ can be expressed as:

$Y_{FIR}(z) = H_{1FTR} Y_1 + H_{2FTR} Y_2$ (expression six)

$= H_{1FTR} \{X + NTF_1 Q_1\} + H_{2FTR}$ $\{-Q_1 + NTF_2 Q_2/A_1\}$ $= (a_0 + a_2 z^{-1} + a_2 z^{-2} \ldots + a_{n-1} z^{-(n-1)})$ $\{X + (1-z^{-1})^2 Q_1\} -$ $(b_0 - b_1 z^{-1} - b_{n-1} z^{-n} + b_n z^{-(n-1)})$ $\{Q_1 + (1-z^{-1})^2 Q_2/A_1\}$ When an effect of a DC tap coefficient are compiled, the expression becomes:

$Y_{FIR}(z)|_{z=1}=(a_0+a_1+a_2 \ldots +a_{n-1})X-$
$(b_0-b_0-b_{n-1}+b_n)Q_1$ (expression seven)

It is understood that the first stage quantization noise is expressed as proportional to the tap coefficient of the elements which form the second stage post filter. For the simplicity, when the second stage post filter tap coefficient is:

$b_0=1+\epsilon_{b0}, b_1=1+\epsilon_{b1}, b_{n-1}=1+\epsilon_{bn-1}, b_n=1+\epsilon_{bn}$ we obtain:

$YFIR(z)|_{z=1}=(a_0+a_1+a_2 \ldots +a_{n-1})X-$
$(\epsilon_{b0}-\epsilon_{b1}-\epsilon_{bn-1}+\epsilon_{bn})Q_1$ (expression eight)

Therefore, the first stage quantization noise $Q_1$ in the output is expressed as proportional to the sum and the product of the tap coefficient $\epsilon_{bi}$.

In this way, while by using a cascade type delta sigma modulator which uses an analog FIR filter it becomes possible to reduce out-of-band quantization noise, there is a problem in that the noise caused by a mismatch of the elements which form the post filter increases the in-band noise.

An exemplary embodiment includes: a first circuit which receives a first input signal, a second circuit which receives a second input signal, a third circuit which receives an output signal from the second circuit, a fourth circuit which receives an output signal from the third circuit, an adder circuit which adds the output signal of the first circuit and the output signal of the fourth circuit, wherein the first circuit is combined with an digital analog conversion device and an analog FIR filter, in the case where the transfer function of either the second circuit or the third circuit is given as $(1-z^{-1})$, the transfer function of the other circuit of either the second circuit or the third circuit is given as $(1-z^{-n})$, and the transfer function of the fourth circuit is given as $H_{FIR}(z)=1+z^{-1}+z^{-2}\ldots+z^{-(n-1)}$, then either the second circuit or the third circuit which has the transfer function $(1-z^{-1})$ is formed by an analog circuit and the other circuit which has the transfer function $(1-z^{-n})$ is formed by a digital circuit.

According to exemplary embodiments, even in the case where there is nonuniformity in the elements which form a digital analog conversion apparatus which converts a digital signal into an analog signal, it is possible to realize a digital analog conversion device which can generate a high quality analog signal, having a high resolution and small circuit size.

DETAILED DESCRIPTION OF THE INVENTION

The structure of a post filter which is placed after a second stage modulator in the case where an analog FIR filter is placed after a cascade type delta sigma modulator of a preferred embodiment is as follows.

When the order of the internal modulator of a cascade type delta sigma modulator is the first order, if $H_3 = NTF_1 = (1-z^{-1})$ then:

$$H_3 H_{FIR} = (1-z^{-1})(1+z^{-1}+z^{-2}\ldots+z^{-(n-1)}) \quad \text{(expression nine)}$$
$$= (1-z^{-n}) \cdot 1$$

And when the order of the internal modulator is the second order:

$$\text{If } H_3 = NTF_1 = (1-z^{-1})^2 = (1-z^{-1})(1-z^{-1}) \text{ then;} \quad \text{(expression ten)}$$
$$H_3 H_{FIR} = (1-z^{-1})(1+z^{-1}+z^{-2}\ldots+z^{-(n-1)})(1-z^{-1})$$
$$= (1-z^{-n}) \cdot (1-z^{-1})$$

In either the expression nine or the expression ten, because $(1-z^{-n})$ is included in $H_3H_{FIR}$, a first characteristic of a preferred embodiment is that this term $(1-z^{-n})$ is separated from the post filter and is digitally processed in advance.

Figure 1:
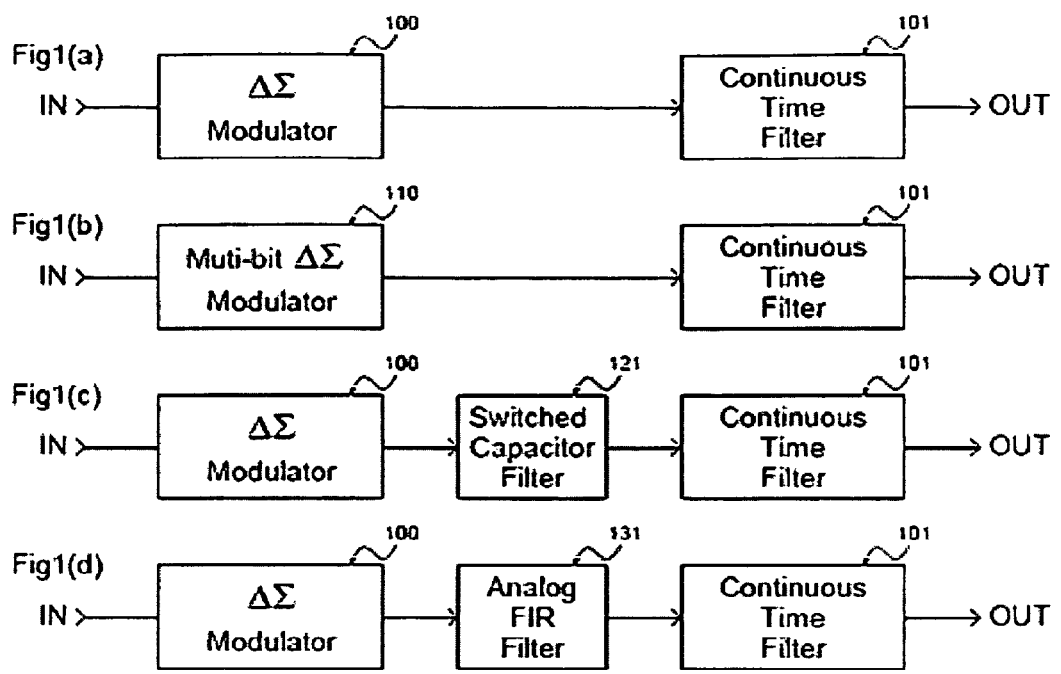
FIG. 1 is an example of digital analog conversion apparatus which uses a delta sigma modulation circuit.
Figure 2:
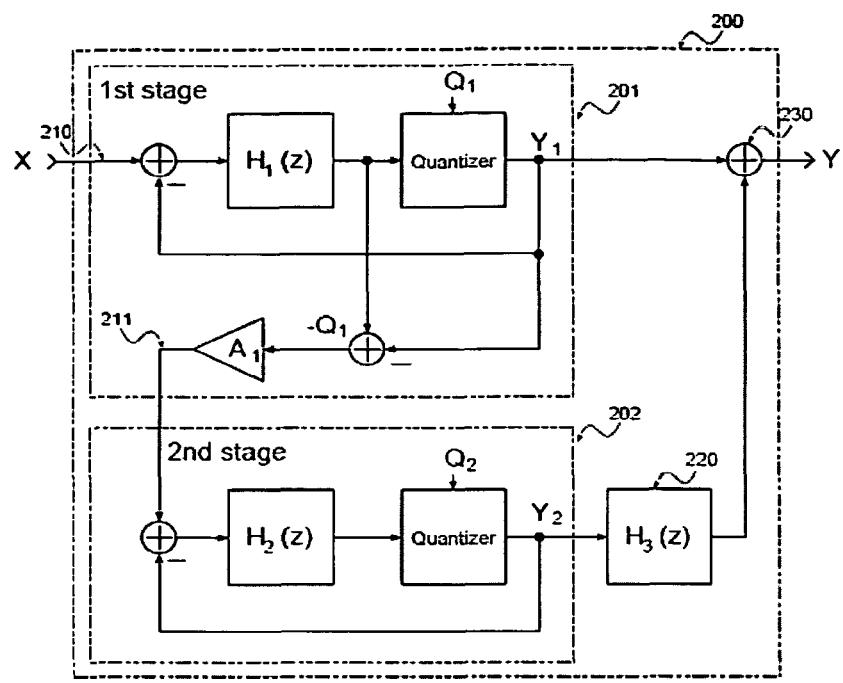
FIG. 2 is an example of a cascade type delta sigma modulator.
Figure 3:
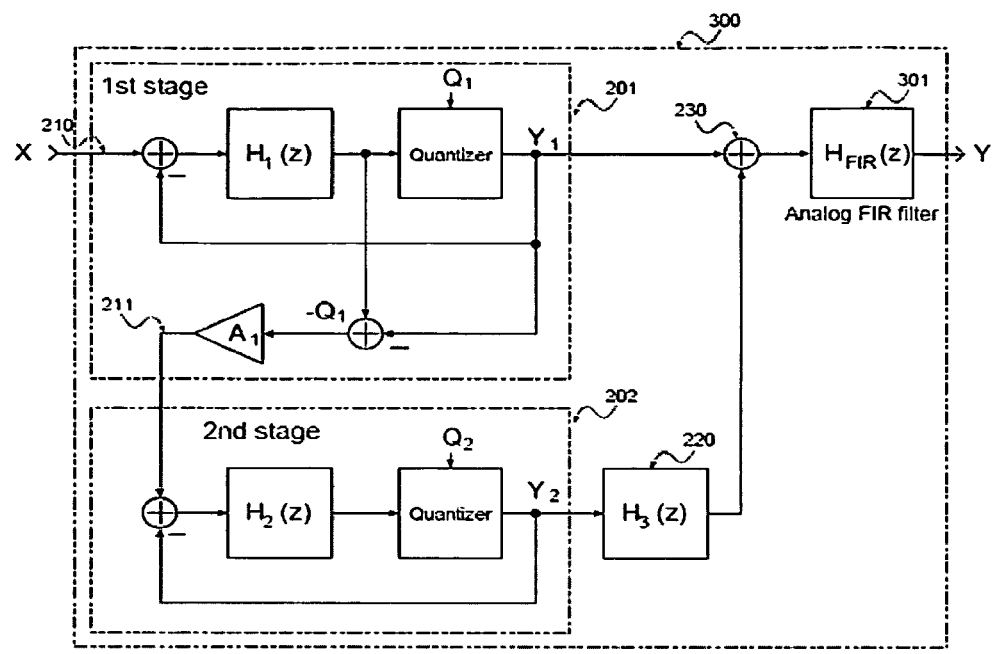
FIG. 3 is an example of a structure in which an analog FIR filter is placed after a cascade type delta sigma modulator.
Figure 4:
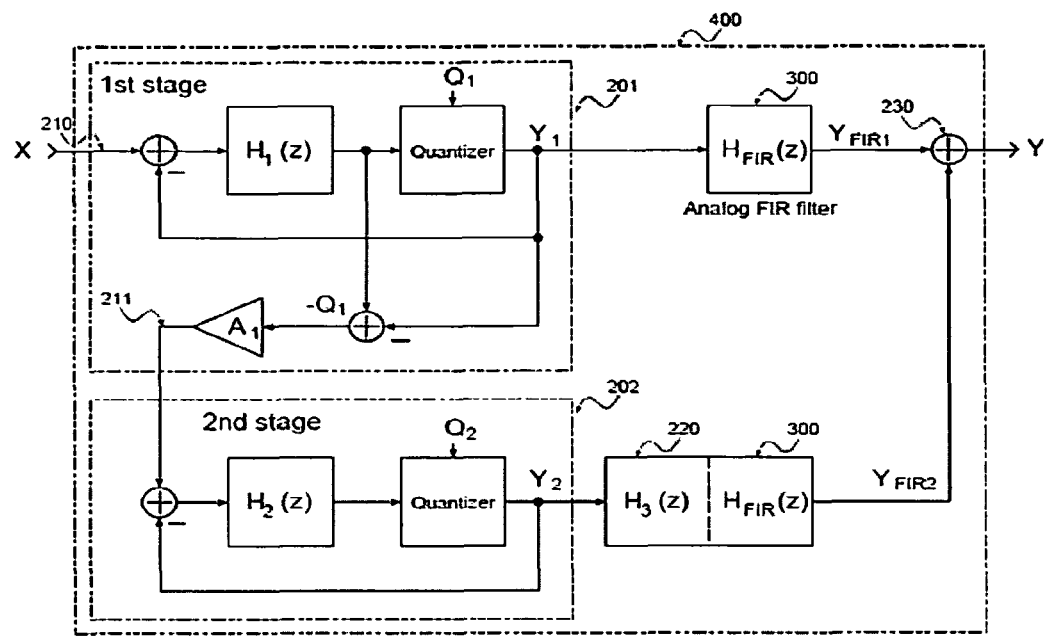
FIG. 4 is another example of a structure in which an analog FIR filter is placed after a cascade type delta sigma modulator.
Figure 5:
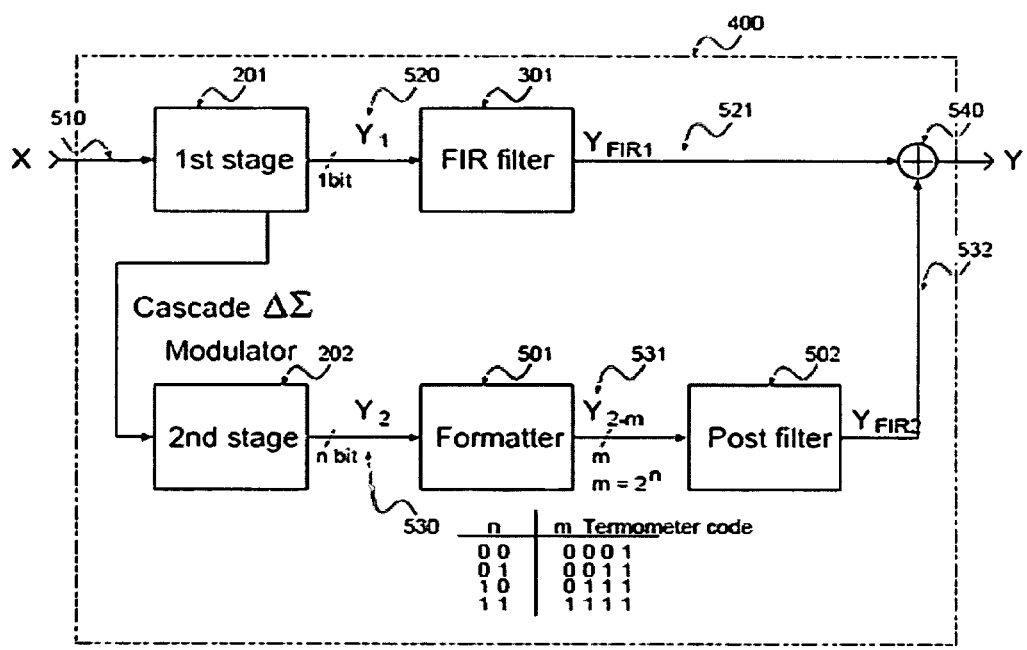
FIG. 5 is block diagram of an example of a structure in which an analog FIR filter is placed after a cascade type delta sigma modulator.
Figure 6:
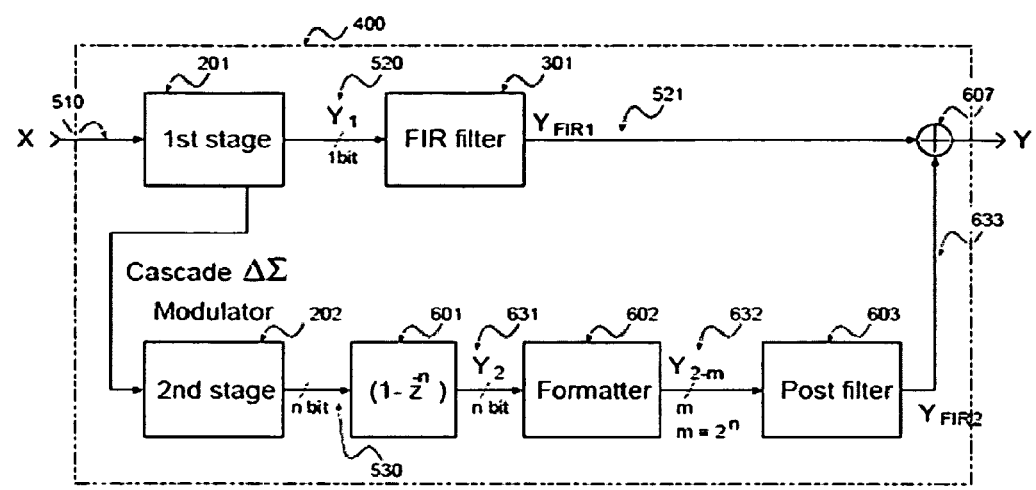
FIG. 6 is an example of digital analog conversion apparatus which uses a cascade type delta sigma modulator of the digital analog conversion apparatus of a first example according to a preferred embodiment.

On the other hand, a second characteristic of a preferred embodiment is that the items other than $(1-z^{-n})$ undergo a calculation process in the post filter after once being converted to a thermometer code by the formatter, Example One FIG. 6 shows a first example in which an analog FIR filter and a post filter is placed after a cascade type delta sigma modulator of the digital analog conversion apparatus of a preferred embodiment. In the present example, the first stage of the cascade type delta sigma modulator is comprised of a single bit internal modulator and the second stage is comprised of an n bit internal modulator.

Here, a digital input signal (510) is input to a first stage internal modulator (201) of the cascade type delta sigma modulator, the second stage internal modulator (202) is connected by a cascade connection to the first stage internal modulator (201), and an output signal (520) output from the first stage internal modulator (201) is input to an analog FIR filter (301). A $(1-z^{-n})$ calculation of an output signal (530) output from the second stage internal modulator (202) is performed by a digital signal process block (601). An output (631) form the digital signal process block (601) is converted to a thermometer code from a binary code by a formatter circuit (602) and output. This signal (632) which is converted to a thermometer code is input to a post filter circuit (603). An output signal (521) from the analog FIR filter (301) and an output signal (633) from the post filter circuit (603) are analogically added by an adder block (540) and output.

Figure 7A:
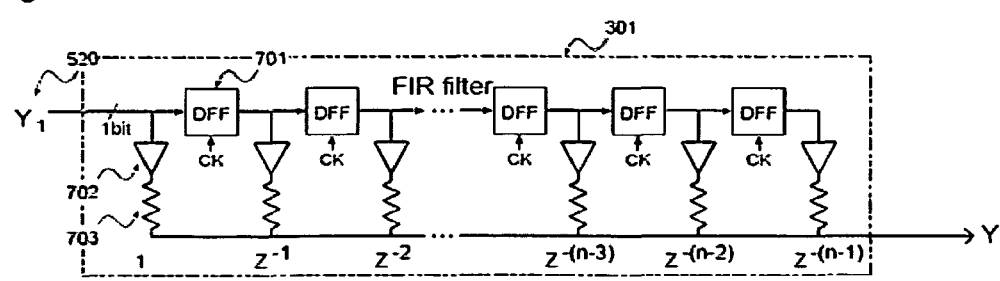
FIG. 7 is a circuit structure diagram of the first example.

FIG. 7a shows a first example of the digital/analog conversion apparatus of a preferred embodiment. The analog FIR filter in this example is formed by a plurality of connected stages, each connected stage forming a unit wherein a one stage unit comprises a delay element (701) which is formed by a DFF which enables one clock delay, a drive buffer (702) connected to an output of the delay element and a resistance element (703) in which one end is connected to the drive buffer and the other end is connected to an output terminal so that a weighted voltage is added as an analog signal.

Figure 7B:
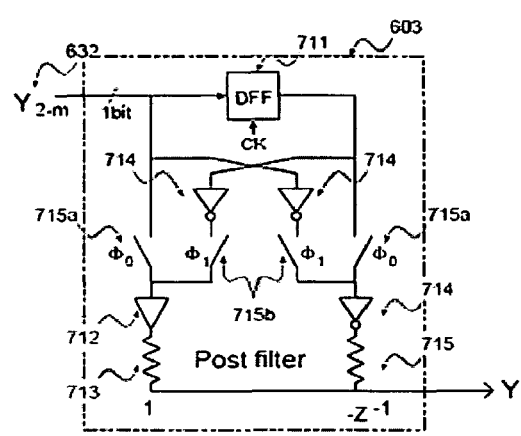

As shown in the expression ten, when the order of the internal modulator is the second order, the transfer function of the second stage is $(1-z^{-n}) \cdot (1-z^{-1})$. Because $(1-z^{-n})$ is digitally processed, it is necessary to analogically calculate $(1-z^{-n})$ by the post filter. FIG. 7b shows an example of the post filter one bit part unit which is placed after the cascade type delta sigma modulator of a preferred embodiment.

Here, an input signal $Y_{2-m}$ (632) expresses a one bit signal of a part of the digital signal, which is converted to a thermometer code by the formatter. A unit of the post filter, in which the input signal $Y_{2-m}$ (632) is input, is comprised of a delay element (711) formed by a DFF which enables one clock delay, a drive buffer (712) which is connected to an input via a switch (715a) which is controlled by a signal $\Phi_0$ which is a result of a frequency division of one clock, a resistance element (713) in which one end is connected to the drive buffer and the other end is connected to an output terminal so that a weighted voltage is added as an analog signal, a drive inverter (714) which is connected to an output via the switch (715a) which is controlled by a signal $\Phi_1$ which is similarly a result of a frequency division of one clock, a resistance element (715) in which one end is connected to the drive inverter and the other end is connected to an output terminal so that a weighted voltage is added as an analog signal, an inverter (714) which is connected to an input/output of the delay element (711) formed by the DFF which enables a delay of one clock, and a switch (715b) which is controlled by the signal $\Phi_1$ which is the result of the frequency division of one clock.

Here, the connection of the input/output of the delay element (711), the drive buffer (712) and the drive inverter (714), is switched between the input/outputs of the switches (715a) and (715b). Because the switches (715a) and (715b) are controlled by the signal $\Phi_0$ and $\Phi_1$ which are the results of the frequency divisions of one clock, the connection relationship of the resistance element for each clock forms a swapping circuit. By this swapping circuit, a transfer function $Y_2(z)$ for a sequence of the input digital input signals $y_{21}(n)$, $y_{21}(n+1)$, $y_{21}(n+2)$, ... $y_{21}(n+k)$ (k is an integer) becomes:

$$Y_{2,o}(z) = b_0(1-Z^{-1}), \quad Y_{2,e}(z) = b_1(1-Z^{-1})$$

where $Y_{2,o}$ expresses in the case where k=odd and $Y_{2,e}$ expresses in the case where k=even. In addition, it is assumed there are nonuniformity errors between $b_0$ and $b_1$, resistance elements (713) and (715).

Therefore, because $1-Z^{-1}$ is multiplied to the nonuniformity errors $b_0$ and $b_1$, if calculated assuming z=1:

$$Y_2(z)|_{z=1} = 0$$

That is, by the swapping circuit, an effect of mismatch no longer appears around a direct current regions and illustrates that first order mismatch shaping cancels the nonuniformity.

Figure 8:
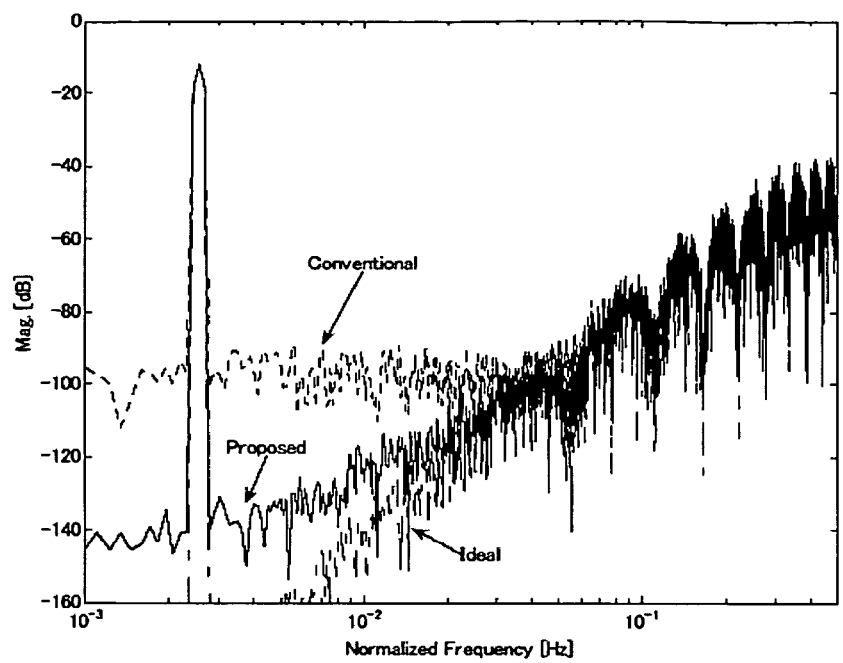
FIG. 8 shows the simulation results of the effects of a digital analog conversion apparatus which uses a cascade type delta sigma modulator of the digital analog conversion apparatus according to a preferred embodiment.

Next, FIG. 8 shows a simulation result of an output spectrum of the entire delta sigma modulator in the case where there is a 1% mismatch in the elements which form the post filter. In the conventional method which does not use a selection switch, it is possible to confirm a significant increase of noise in a low frequency range. However, in the case where the present proposed method is used, it is clear that when the frequency becomes half, the noise in a low frequency range decreases by 6 dB.

In this way, if the present proposed method is used, it is possible to realize a high SNR even in the case where there is nonuniformity of the values of elements such as resistors which are comprised of the digital/analog conversion apparatus, and it is possible to form a digital/analog conversion apparatus having high resolution. Generally, there is about a 0.1% nonuniformity in values of elements in an LSI. In this case also, it is possible to form a digital/analog conversion apparatus having high resolution and a high level of accuracy by using the proposed method.

Example Two

Figure 9:
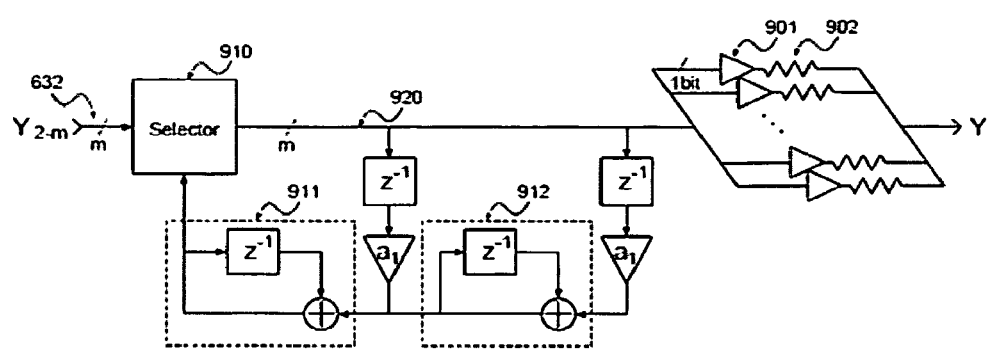
FIG. 9 is a structure diagram of a second example according to a preferred embodiment.

FIG. 9 shows a second example of the digital analog conversion apparatus of a preferred embodiment. In the present example, the first stage of the cascade type delta sigma modulator is comprised of a single bit internal modulator and the second stage is comprised of an n bit internal modulator. As is shown by the expression 9, when the order of the internal modulator is the first order, the transfer function of the second stage is $(1-z^{-n}) \cdot 1$. Because $(1-z^{-n})$ is digitally processed, it is necessary to analogically calculate 1. Here, the input signal $Y_{2-m}$ (632), which is converted into a thermometer code by the formatter, is firstly input to the selector (910), and a unit group comprises drive buffers (901), which are connected to each of the bits from the outputs of the selector, and resistance elements (902) in which each end is connected to one of the drive buffer and each other end is connected to an output terminal so that a weighted voltage is added as an analog signal. In order to cancel nonuniformity among the drive buffers (901) and nonuniformity among the resistance elements (902) by a mismatch shaping method, the selection circuit (910) calculates the usage frequency of each unit comprised of one drive buffer (901) and one resistance element (902) by an integrator circuit (911) and an integrator circuit (912), each of which is comprised of a delay element and an addition circuit, and operates so that the smaller the usage frequency of a unit is the earlier the unit is selected.

According to the present example, when the mismatch shaping method is performed, because a unit selected by the selector (910) is switched without simply relying on the DEM method, which uses a random signal, white noise superimposition caused by a random signal, which is a problem when using the DEM method, is suppressed, and it is unnecessary to introduce a circuit to switch the selector.

Example Three

Figure 10:
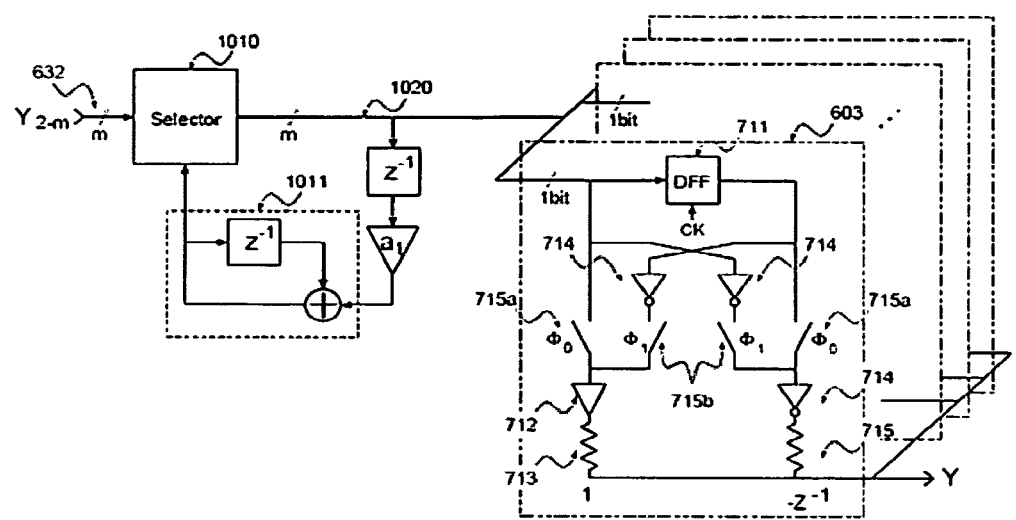
FIG. 10 is a structure diagram of a third example according to a preferred embodiment.

FIG. 10 shows a third example of a digital analog conversion apparatus of a preferred embodiment. In the present example, the first stage of the cascade type delta sigma modulator is comprised of a single bit internal modulator and the second stage is comprised of an n bit internal modulator. As is shown by the expression 10, when the order of the internal modulator is the second order, the transfer function of the second stage is $(1-z^{-n}) \cdot (1-z^{-1})$. Because $(1-z^{-n})$ is digitally processed, it is necessary to analogically calculate $(1-z^{-1})$. Here, the input signal $Y_{2-m}$ (632), which is converted into a thermometer code by the formatter, is firstly input to the selector (1010) and secondly input to one of post filter units (603), which corresponds to each bit of the output (1020) of the selector. A post filter unit (603) is comprised of a delay element (711) formed by a DFF which enables one clock delay, a drive buffer (712) which is connected to an input via a switch (715a) which is controlled by a signal $\Phi_0$ which is a result of a frequency dividing of one clock, a resistance element (713) in which one end is connected to the drive buffer and the other end is connected to an output terminal so that a weighted voltage is added as an analog signal, a drive inverter (714) which is connected to an output via the switch (715a) which is similarly controlled by the signal $\Phi_0$, a resistance element (715) in which one end is connected to the drive inverter and the other end is connected to an output terminal so that a weighted voltage is added as an analog signal, an inverter (714) which is connected to an input/output of the delay element (711) formed by the DFF which enables a delay of one clock, and an output of the inverter, switch (715b) which is controlled by a signal $\Phi_1$ which is a result of the frequency dividing of one clock.

Here, the connection of the input and the output of the delay element (711), the drive buffer (712), and the drive inverter (714), is switched by the input and the output via the switches (715a) and (715b). Because the switches (715a) and (715b) are controlled by the signals $\Phi_0$ and $\Phi1$, which are results of the frequency dividing of one clock, a swapping circuit, in which the connections to resistance elements are swapped for each clock, is realized.

In order to further cancel the nonuniformity among the post filter units (603) by the mismatch shaping method, the selector (1010) calculates each usage frequency of each the post filter unit (603) by an integrator circuit (1011) comprised of a delay element, which is connected to the selector, and an adder circuit, and operates so that the smaller the usage frequency of a post filter unit is the earlier the post filter unit is selected. Furthermore, by arranging more integrator circuits (1011), which control the selector (1010) using the mismatch shaping method as in example two, it becomes possible to make the order of mismatch shaping a higher order.

According to the present example, it is possible to easily realize a high order mismatch shaping by a superimposition of mismatch shaping by a mismatch shaper and mismatch shaping by a swapping circuit. It is possible to realize a higher order mismatch shaping function by a slight addition of hardware, whereas the hardware scale has become large in the conventional technology. For example, it is possible to realize a second order mismatch shaping by using a DWA (Data Weighted Average) as a mismatch shaper.

In one of the first to the third examples, the first stage of the cascade type delta sigma modulator is comprised of a single bit internal modulator and the second stage is comprised of an n bit internal modulator is shown. The same effects of present example can be realized even when using any internal modulator comprising the cascade type delta sigma modulator.

Example Four

Figure 11A:
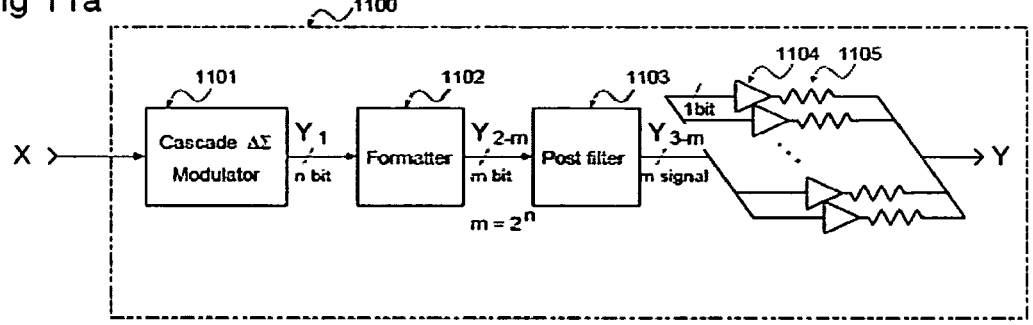
FIG. 11 is a structure diagram of a fourth example according to a preferred embodiment.

FIG. 11a shows a fourth example of the digital analog conversion apparatus of a preferred embodiment. In the present example, the delta sigma modulator is assumed to have an n bit output. In the present example, a mismatch shaping method is performed by a post filter (1103) on the signal $Y_{2-m}$ in which the n bit output of the delta sigma modulator (1101) is converted into a thermometer code by a formatter (1102), and this output is added as an analog signal via drive buffer circuits (1104) and resistance elements (1105).

Figure 11B:
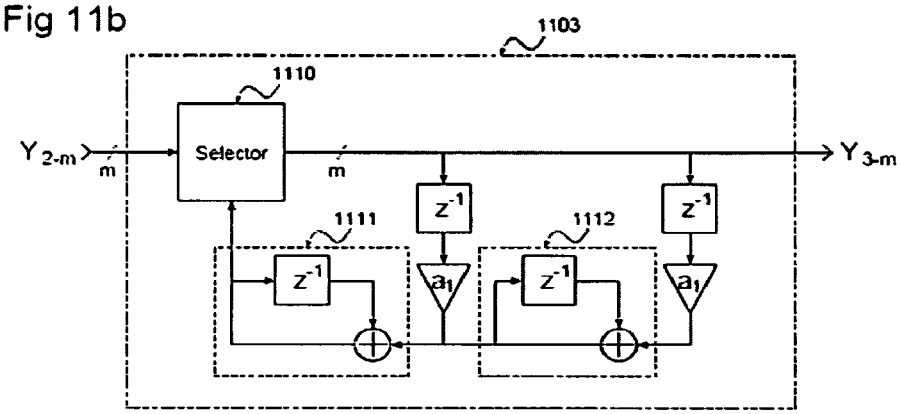

FIG. 11b shows an example of a post filter (1103). In order to cancel the nonuniformity among the drive buffer circuits (1104) and the nonuniformity among the resistance elements (1105) by a mismatch shaping method, the selector (1010) calculates the usage frequency of each output signal by the integrator circuit (1111) and the integrator circuit (1112), each of which is comprised of a delay element and an adder circuit, and operates so that the smaller the usage frequency of an output of the selector (1010) is the earlier the output signal is selected. Here, the integrator circuit calculates an input signal as an mbit vector signal.

In the present example, since the mismatch method is used by the post filter which uses the integrator circuits when driving a plurality of speakers by a plurality of drive circuits, white noise superimposition caused by a random signal, which is a problem when using the mismatch shaping method by the DEM method as in conventional examples, is suppressed and it is unnecessary to introduce a circuit to switch the selector in high speed.

In the present example, an example in which a plurality of resistance elements are driven and audio signal is analogically added is shown. It is further possible to apply the present example to any method to add as an analog signal by a plurality of drive apparatus.

Furthermore, in the present example, two integrator circuits (1110) are used to control the selector (1110) in the mismatch shaping method. However, it is possible to obtain an effect of the mismatch shaping method even using only one integrator circuit (1110) or more.

Figure 12:
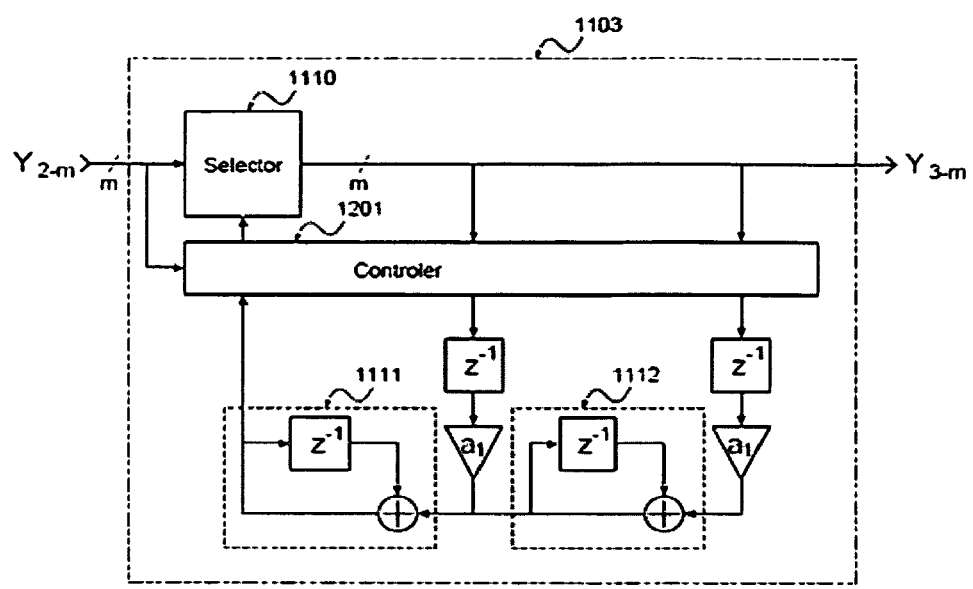
FIG. 12 is a circuit structure diagram of the fourth example according to a preferred embodiment.

FIG. 12 shows another example of a post filter (1103). In order to cancel the nonuniformity among the speaker drivers by a mismatch shaping method, the selector (1010) calculates the usage frequency of each output signal by the integrator circuit (1111) and the integrator circuit (1112), each of which is comprised of a delay element and an adder circuit, and operates so that the smaller the usage frequency of an output signal of the selector (1110) is the earlier the output signal is selected. However, a controller (1201) which is arranged between the input/output of the integrator circuits and the selector controls an output signal selected by the selector according to the amplitude of the input. The controller (1201) operates so that fewer output drive circuits are selected when the amplitude of the digital input signal is smaller and controls so that all the output drive circuits are selected when the amplitude is large enough. In this way, because only one output drive circuit is selected when the amplitude of a signal is small enough, it is possible to reduce the effects of the nonuniformity among the drivers with small amplitudes, as well as to improve the sound localization because a sound is only emitted from a specific driver when the amplitude is small. In addition, by dynamically controlling the number of drivers according to the amplitude of the input signal, it is also possible to optimize the power consumption consumed by the drivers. As stated in one of the first to fourth examples, after performing noise shaping of a digital input signal by a delta sigma modulator and after dividing the signal by a formatter and then performing mismatch shaping by a post filter, a plurality of drivers are driven and the signal is added as an analog signal. This is one of characteristics of a preferred embodiment.

As a result, even in the case where each power of a plurality of the drivers is small, it is possible to obtain a large output by adding the plurality of analog signals of the plurality of the drivers.

It is possible to apply the digital analog conversion apparatus which converts a digital signal into an analog signal as stated in the first to fourth examples to any apparatus which convert a digital audio signal into a plurality of digital signals and add the output of a plurality of drivers as an analog signal.

Example Five

Figure 13A:
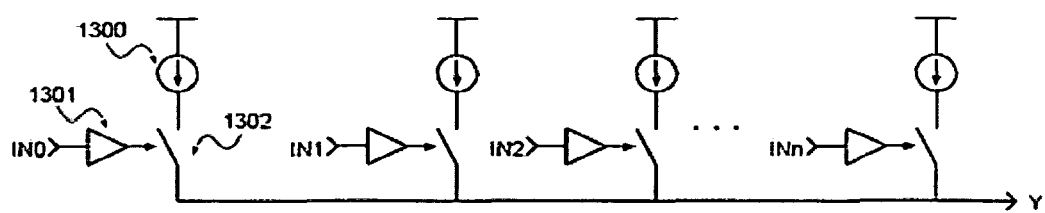
FIG. 13a is a structure diagram of a fifth example according to a preferred embodiment.

FIG. 13a shows a fifth example in the case where a digital analog conversion apparatus shown in one of the first to fourth examples adds a electric current. The present example shows a structure in which each of the drive buffer and resistance elements which comprises the previous examples are replaced by a current source (1300), a switch circuit (1302) arranged between the current source and an output, and a buffer circuit (1301) which controls the switches by digital signals.

Example Six

Figure 13B:
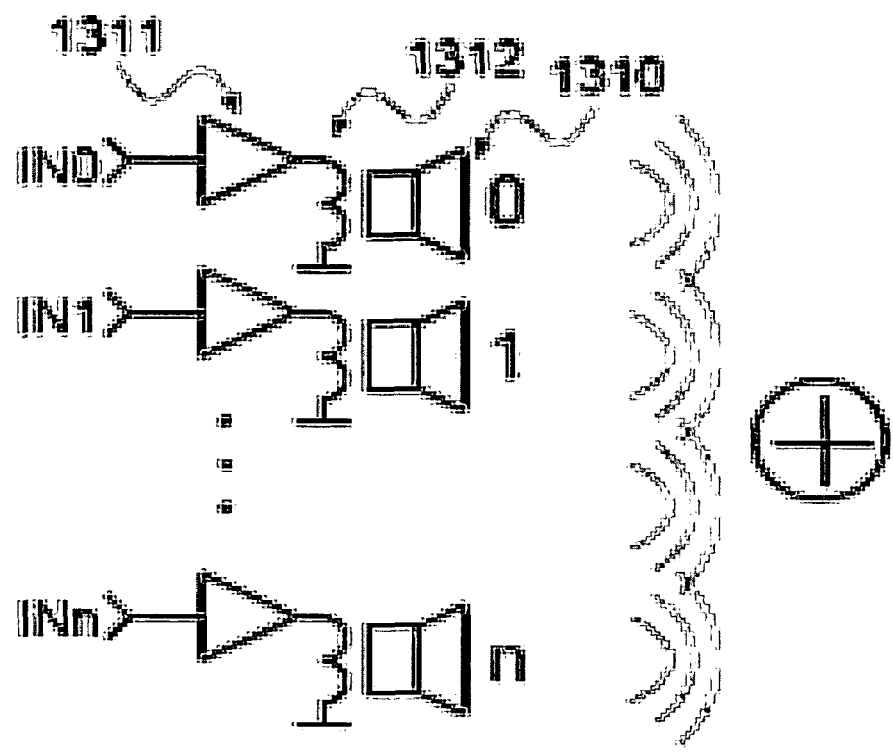
FIG. 13b is a structure diagram of a sixth example according to a preferred embodiment.

In addition, FIG. 13b shows a sixth example in the case where a digital analog conversion apparatus in one of the first to fourth examples, such as shown in FIG. 13a, adds sound pressure level. The present example shows a structure in which each of the drive buffers and resistance elements which comprises the previous examples are replaced by a speaker device (1310), a voice coil (1312) which drives a speaker device, and a driver (1311) which controls a voice coil by a digital signal.

Example Seven

Figure 13C:
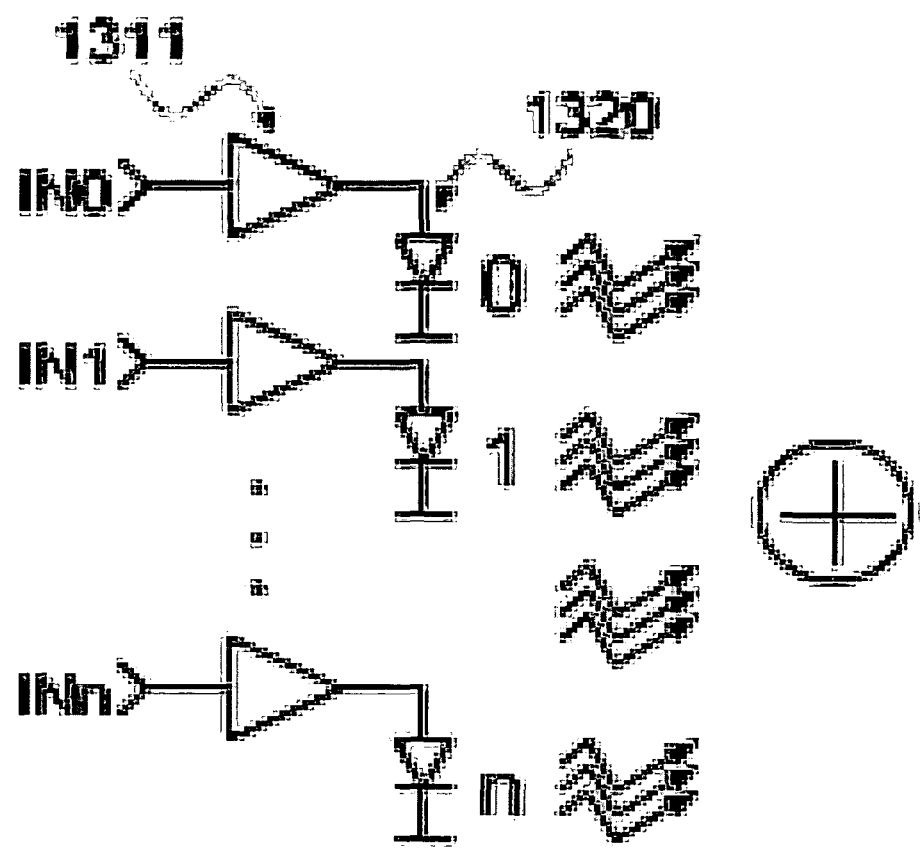
FIG. 13c is a structure diagram of a seventh example according to a preferred embodiment.

Furthermore, FIG. 13c shows a seventh example in the case where a digital analog conversion apparatus in one of the first to fourth examples, such as shown in FIG. 13a, adds light strength. The present example shows a structure in which each of the drive buffers and resistance elements which comprises the previous examples are replaced by a light emitting element (1320), a drive circuit (1321) which controls the light emitting element by a digital signal. Furthermore, as a light emitting element in the present example, it is possible to use any device which can emit light by electrical power such as a lamp or LED.

Example Eight

Figure 14A:
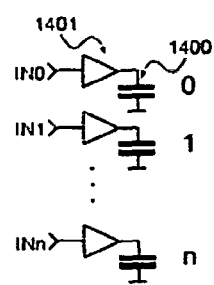
FIG. 14 is a structure diagram of an eighth example according to a preferred embodiment.
Figure 14B:
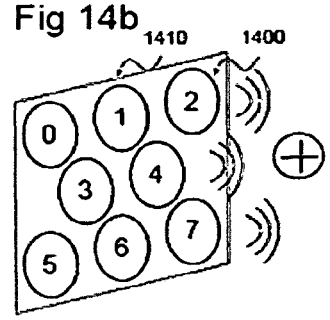

Furthermore, FIG. 14a shows an eighth example in the case where a digital analog conversion apparatus shown in one of the first to fourth examples, such as shown in FIG. 13a, which adds its outputs by piezoelectric elements. The present example shows a structure in which each of the drive buffers and resistance elements which comprises the previous examples are replaced by a piezoelectric element (1400) and a buffer circuit (1401) which controls the piezoelectric element by a digital signal. Because a piezoelectric element can convert an electrical signal into a physical displacement, by arranging a plurality of piezoelectric elements on a flat surface as in FIG. 14b, it is possible to apply this example to an application which for example, synthesizes a physical displacement amount in a space as a sound wave, adds by driving a common amplitude plate or as is shown in FIG. 14c, adds by stacking a plurality of piezoelectric elements.

Because each piezoelectric element is driven by a single bit signal, improvement in the power efficiency becomes possible and it is possible to reduce the effects of nonlinearity of a piezoelectric element.

Furthermore, in the present example, a method is shown of converting an electrical signal into a physical displacement by a piezoelectric element. It is further possible to use any element which can covert an electrical signal into a physical displacement.

Figure 14C:
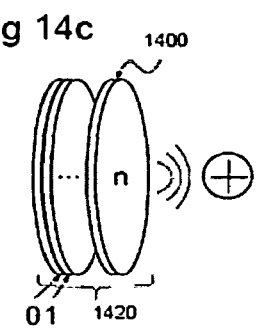

As in the above stated example of FIG. 14c, in the case of the addition of displacement through stacking the plurality of piezoelectric elements (1420), it is also possible to measure the strength of a physical displacement which each piezoelectric element generates by using a different piezoelectric element. In other words, because it is possible to measure the nonuniformity in strength of a physical displacement which a plurality of piezoelectric elements generate, by adjusting the driver power of a piezoelectric element according to the measured nonuniformity, it is also possible to improve the accuracy of the synthesized physical displacement by adding the physical displacements which the plurality of piezoelectric elements generate.

Example Nine

Figure 15A:
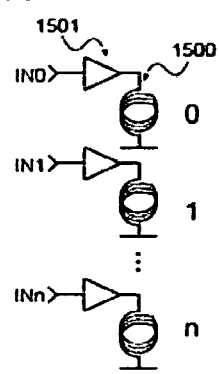
FIG. 15 is a structure diagram of a ninth example according to a preferred embodiment.
Figure 15B:
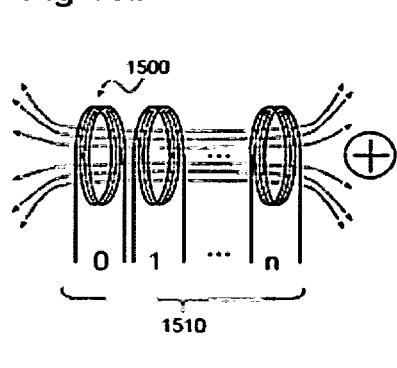
Figure 15C:
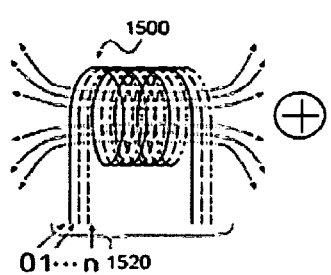

FIG. 15a shows a ninth example in the case where a digital analog conversion apparatus in one of the first to fourth examples adds a magnetic field generated by a coil. The present example shows a structure in which each of the drive buffers and resistance elements which comprises any of the previous examples are replaced by a coil (1500) and a buffer circuit (1401) which controls the coil by a digital signal. Because a coil can convert an electrical signal into a magnetic field, by stacking (1510) a plurality of coils as shown in FIG. 15b, it is possible to apply this example to an application in which, for example, the magnetic fields are added as is shown in FIG. 15c, or the magnetic fields are added with simultaneously interweaving the plurality of coils.

As in the example stated above, because magnetic fields can be added, it is possible to apply a preferred embodiment to a digital analog conversion apparatus which reproduces an audio signal using a speaker driver which uses a plurality of voice coils.

As in the example stated above, it is possible to measure the strength of a magnetic field which each coil generates by using a different coil. In other words, because it is possible to measure nonuniformity of strength of a magnetic field which a plurality of coils generate, by adjusting the drive power of a coil according to the measured nonuniformity, it is also possible to improve the accuracy of the synthesized magnetic field by adding the plurality of magnetic fields.

Example Ten

Figure 16A:
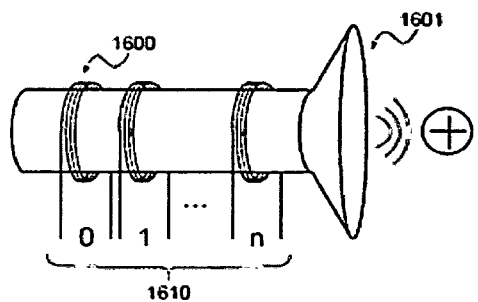
FIG. 16 is a structure diagram of a tenth example according to a preferred embodiment.

FIG. 16a shows a tenth example of a digital analog conversion apparatus in one of the first to fourth examples in which it is applied to a speaker drive device which uses a plurality of voice coils. The present example shows a structure in which the resistance elements which comprises the previous examples are replaced by voice coils (1600). Because the voice coils can convert an electrical signal into sound pressure generated by a cone (1601) or dome, by arranging the plurality of voice coils as shown in FIG. 16a, it is possible to add the sounds pressure. In addition, sound localization is improved in this method which uses voice coils because the part which radiates the audio signal becomes one cone (1601) or one dome.

Figure 16B:
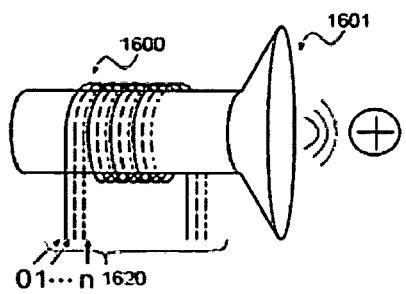

In addition, the above example can be used in an application in which sound pressures are added by bunching and interweaving (1620) the plurality of voice coils as shown in FIG. 16b. By bunching and interweaving the plurality of voice coils it is possible to make the characteristics of each voice call uniform. In this way, it is possible to reduce differences of the characteristics between voice coils and reproduce a high quality analog signal.

As in the above stated example, it is possible to measure the strength of a magnetic field which each voice coil generates by using a different voice coil. In other words, because it is possible to measure nonuniformity of strength of a magnetic field which a plurality of voice coils generate by adjusting the drive power of a voice coil according to the measured nonuniformity, it is also possible to improve the accuracy of the synthesized audio signal by adding the plurality of magnetic fields and reproduce an analog signal with a high quality sound.

In any of the fifth to tenth examples stated above, an n bit output from a cascade type delta sigma modulator is output by adding a plurality of drivers as an analog signal using a formatter and a post filter. Because the n bit signal is converted into an m=$2^n$ signal thermometer code by the formatter, $2^n$ post filters and drivers are required. Here, by making m=$2^n$=16 or less, it becomes possible to prevent a significant increase in the circuit size of a mismatch shaping circuit or a swapping circuit. Similarly, by making m=2n=16 or less, it is possible to reduce nonuniformity of the characteristics which is a cause of a difference in a stacking order of each element when piezoelectric element are stacked as in the example shown in FIG. 14c. In addition, it is also possible to reduce nonuniformity of the characteristics which is a cause of a difference in a stacking order of each coil when coils are stacked as in the example shown in FIGS. 15c and 16a. Furthermore, even in the examples in which the coils are bunched and interwoven as in FIGS. 15c and 16b, it is possible to reduce nonuniformity of the characteristics of each coil.

Example Eleven

Figure 17:
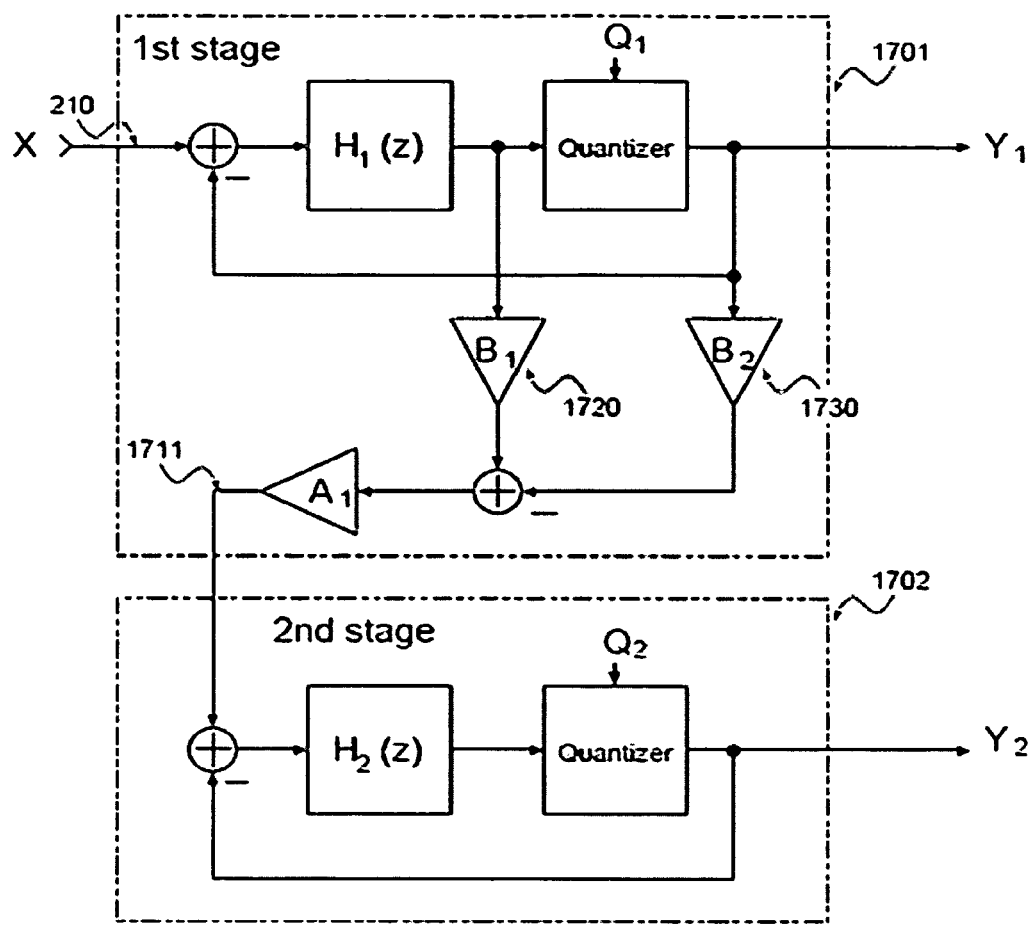
FIG. 17 is a structure diagram of an eleventh example according to a preferred embodiment.

FIG. 17 shows an eleventh example of a preferred embodiment which uses a different modulator from the cascade type delta sigma modulator of a digital analog conversion apparatus shown in one of the first to fourth examples. In order to transfer an input signal to a first stage output (1711) of a cascade type delta sigma modulator (1700), a structure is possible where a coefficient $B_0$ (1720) and a coefficient $B_1$ (1730) are used for each respectively. In this type of connection, because one part the input signal from the output of the delta sigma modulator of stages subsequent to a second stage is also output, in the case where the number of stages of the cascade type delta sigma modulator is increased or in an application which adds sounds pressure in a space using a plurality of speaker devices, it is possible to improve the output sound pressure together with an increase in the plurality of speaker devices.

Example Twelve

Figure 18:
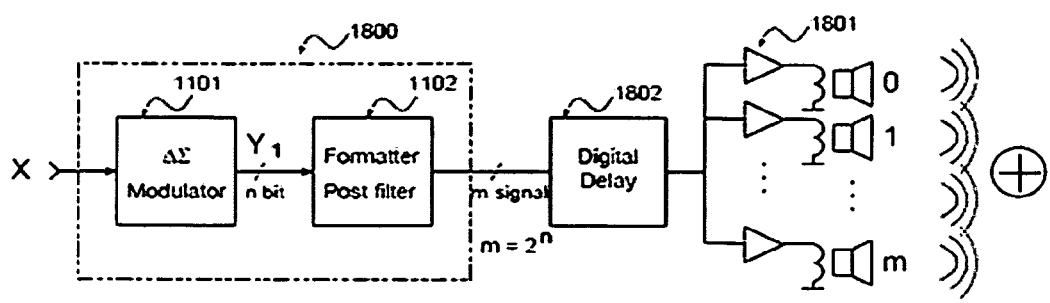
FIG. 18 is a structure diagram of a twelfth example according to a preferred embodiment.

FIG. 18 shows a twelfth example of the digital analog conversion apparatus shown in any of the first to fourth examples in which a block (1802) which digitally delays a signal for driving a drive device (1801) is inserted in an application which adds sound pressure in a space using a plurality of drive devices shown in such as the sixth eight, and tenth examples. In this way, by digitally delaying a signal from the delta sigma modulator and formatter, and by controlling the phase of the signal to each drive device, it becomes possible to change directionality of a sound signal which is radiated in a space.

For example, in the case where d is the distance between each speaker, $\lambda_s$ is the wavelength of a signal and $\theta$ is the deviation where the speaker front surface is assumed to be 0 radian, it is possible to generate a directionality of $\theta$ on the SP1 side by making the phase of SP2 to SP3 delayed by $(2\pi d \sin\theta)/\lambda_s$, and by making the phase of SP1 $(4\pi d \sin\theta)/\lambda_s$.

Conventionally, in order to control the phase of a plurality of speakers, as stated above, a structure which has a complex phase shifter is necessary. However, in the present example, because the input/output signal is a digital signal, it is possible to easily control a phase accurately using a digital delay device (for example, a DFF).

Example Thirteen

Figure 19A:
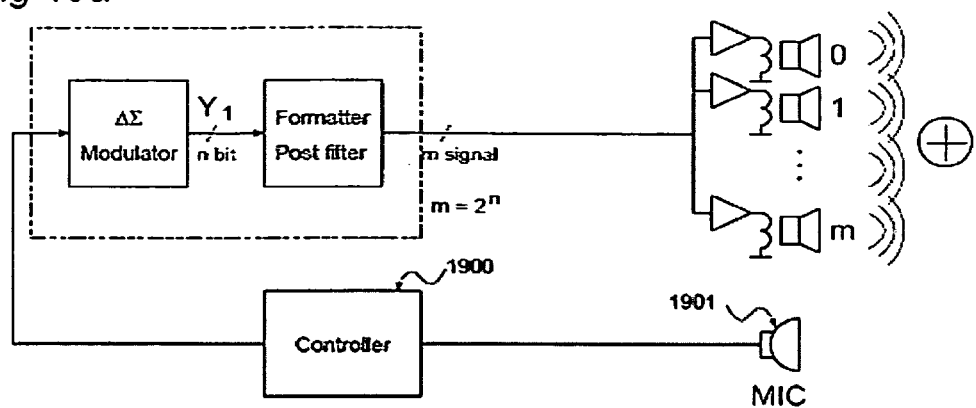
FIG. 19 is a structure diagram of a thirteenth example according to a preferred embodiment.
Figure 19B:
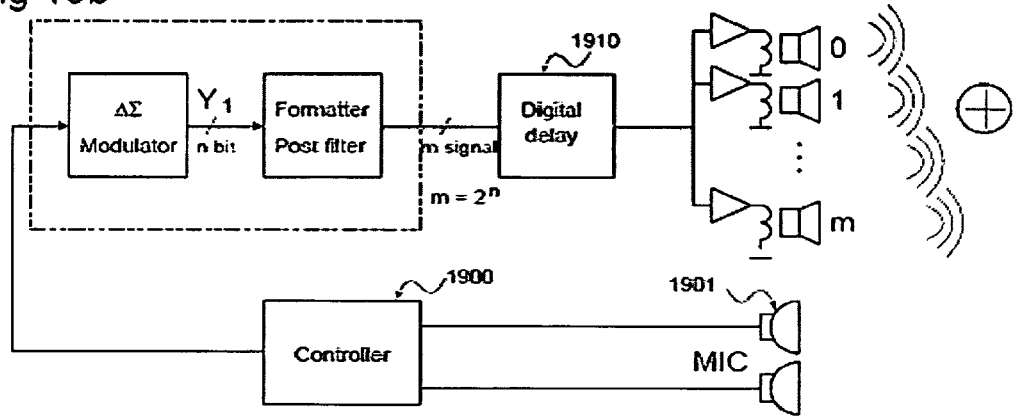

FIG. 19a shows a thirteenth example of a digital analog conversion apparatus shown in one of the first to fourth examples in which surrounding/peripheral noise is fed back as an input to the digital analog conversion apparatus which is applied to an application which adds sound pressure in a space using a plurality of drive devices as in the sixth example, the eighth example, and the tenth example. Here, a feed-back controller (1900) calculates a sound pressure and a phase necessary to generate a signal the phase of which counteracts the peripheral noise and is revolved 180 degrees based on peripheral noise data from a microphone (1901) into which the peripheral noise is input. According to a preferred embodiment, because it is possible to directly control a speaker by a digital circuit, it is possible to form an accurate noise reduction device. In addition, as is shown in FIG. 19b, because it is generally possible to detect the direction of the source of a noise by using a plurality of microphones, by controlling the phase to each speaker drive device using the technology in the twelfth example it is possible to make the speakers for noise reduction have directional characteristics. In other words, it is possible to reduce noise not only in the front direction of the speakers for noise reduction but also in other directions.

In the case of noise reduction inside an automobile, there is a plurality of in-out noise sources and each noise source is different. By applying the present example, it is possible to easily arrange a plurality of speakers for noise reduction. In addition, because it is possible to reduce noise in directions other than a front direction by using a plurality of speakers, it is possible to efficiently reduce noise inside an automobile. Furthermore, because it is possible to realize a thin type noise reduction device if a sound pressure speaker is used, it is possible to reduce noise without reducing interior space inside the automobile.

Example Fourteen

Figure 20:
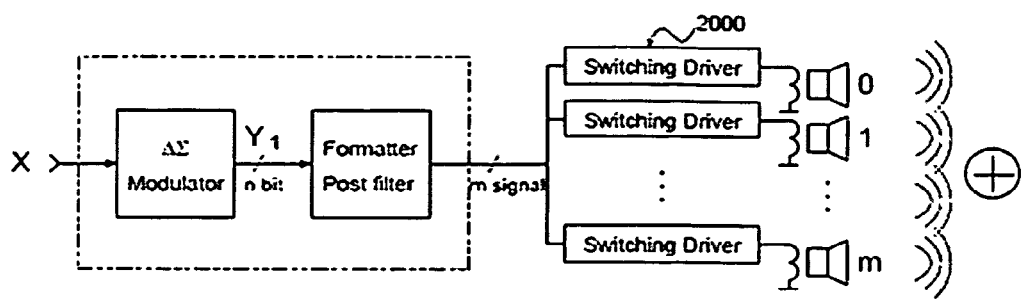
FIG. 20 is a structure diagram of a fourteenth example according to a preferred embodiment.

FIG. 20 shows a fourteenth example of a digital analog conversion apparatus shown in one of the first to fourth examples in the case where a drive device (2000) is formed by a switching amplifier, and the digital analog conversion apparatus is used in an application in which sound pressure is added in a space using a plurality of drive devices as in the sixth example, the eighth example, and the tenth example. It is possible to use an analog D level amplifier, a digital D level amplifier, an analog delta sigma modulator and a digital delta sigma modulator as a switching amplifier. Because the digital signal which is input is converted to a switching signal (a 2 level signal or a 3 level signal) by the switching amplifier, it is possible to improve efficiency and output power.

Example Fifteen

FIG. 21 shows a fifteenth example of a digital analog conversion apparatus shown in one of the first to fourth examples, and the digital analog conversion apparatus is related to speakers (2100) and an arrangement method of electrical elements which can convert an electrical signal into a physical displacement in an application which the sound pressure is added in a space using a plurality of drive devices as in the sixth example, the eighth example, and the tenth example.

Figure 21A:
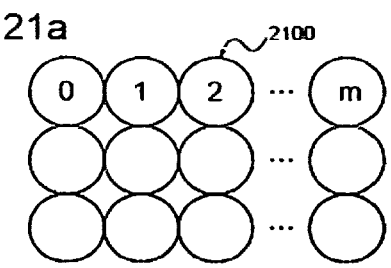
FIG. 21 is a structure diagram of a fifteenth example according to a preferred embodiment.

FIG. 21a shows an example of a grid placement. By this placement it is possible to efficiently arrange sub-units in the case where a rectangle or square case is covered and a horizontal direction and vertical direction become similar shapes and it is possible to realize equal phase characteristics. In addition, in the case where a rectangle or square object is used for the speaker it is possible to arrange the rectangular surface without any wasted spaces and it is possible to maximize radiated sound pressure per unit of space. This type of arrangement is also visually appealing.

Figure 21B:
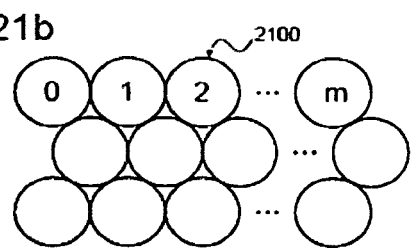

FIG. 21b shows an example of an arrangement in which the position of every other row is misaligned by half. By making this zigzag arrangement it is possible to improve area density compared to a grid arrangement. Particularly, in the case where multiple speakers are arranged, it is possible to increase a sound pressure per a unit space. Furthermore, if the shape of a speaker is a hexagonal shape, it is possible to have a zigzag arrangement without any wasted space. Because it is possible to have an arrangement without any wasted space it is also possible to realize a high sound pressure level. In addition, in the case where mismatch shaping technology is used, because the distance between each speaker is short, it is possible to effectively realize mismatch shaping effects.

Figure 21C:
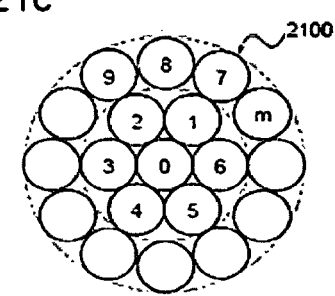

FIG. 21c shows an example of an arrangement in which speakers are arranged in concentric circles. In this way, because the distance of a speaker arranged on each concentric circle is equal from the center point of the whole speakers, the phase characteristics from the same concentric circle to the center point become equal, and thus addition of a front audio signal becomes ideal. As a result, it is also possible to improve sound characteristics.

Example Sixteen

Figure 22:
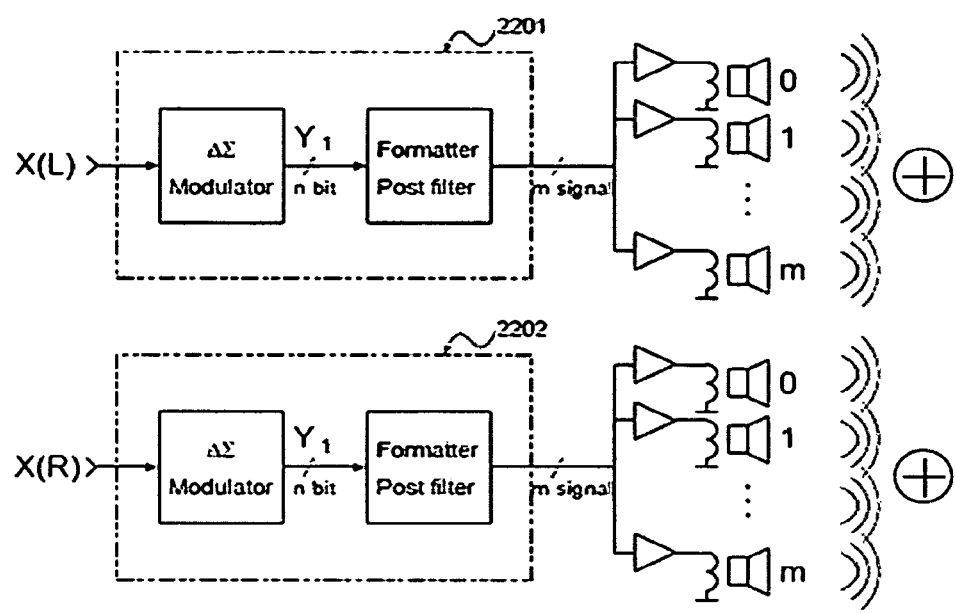
FIG. 22 is a structure diagram of a sixteenth example according to a preferred embodiment.

FIG. 22 shows a sixteenth example of a digital analog conversion apparatus shown in one of the first to fourth examples, and the digital analog conversion apparatus has a stereo structure in an application in which the sound pressure in a space is added using a plurality of drive devices as in the sixth example, the eighth example, and the tenth example. Here, one channel (2201) is comprised of a digital analog conversion device for R signals and another channel (2202) is comprised of a digital analog conversion device for L signal. In this way, by arranging the digital analog conversion devices as a plurality of parallel channels it is possible to not only reproduce stereo audio but also reproduce an arbitrary sound field which is generated by digital processing.

Example Seventeen

FIG. 23 shows a seventeenth example of a digital analog conversion apparatus as shown in the sixteenth example, and the digital analog conversion apparatus is related to speakers (2100) and an arrangement method of electrical elements which can convert an electrical signal into a physical displacement, such as in an application in which the sound pressure is added in a space using a plurality of drive devices as in the sixth example, the eighth example, and the tenth example.

Figure 23A:
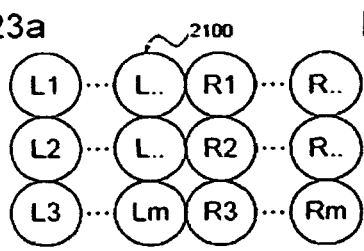
FIG. 23 is a structure diagram of a seventeenth example according to a preferred embodiment.
Figure 23B:
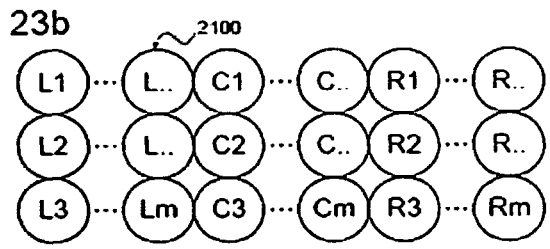
Figure 23C:
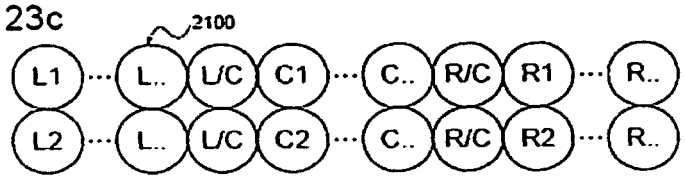

FIG. 23a shows an arrangement method of speakers which are driven by the stereo L and R signals. By symmetrically arranging the L and the R it is possible to increase the stereo effects. The L in the diagram represents a left channel and the R represents a right channel. In FIG. 23b, an arrangement method of a speaker which is driven by a C signal in addition to L and R signals, is shown. The C in the diagram represents a center channel. Furthermore, in a preferred embodiment, because it is possible to easily and dynamically change an allocation to a plurality of speaker channels, by dynamically changing an allocation to channels by a reproduced music source and realized sound field effects, it is possible to further effectively achieve a stereo effect and a sound filed effect. FIG. 23c shows a speaker arrangement method in the case where an allocation to a plurality of speaker channels is dynamically controlled. An arrangement method of a speaker which is driven by the C signal in addition to the L and the R signal is shown. The L/C in the diagram shows a speaker that can be driven by both the L signal and the C signal. Also, the R/C in the diagram shows speaker that can be driven by both the R signal and the C signal.

Example Eighteen

Figure 24:
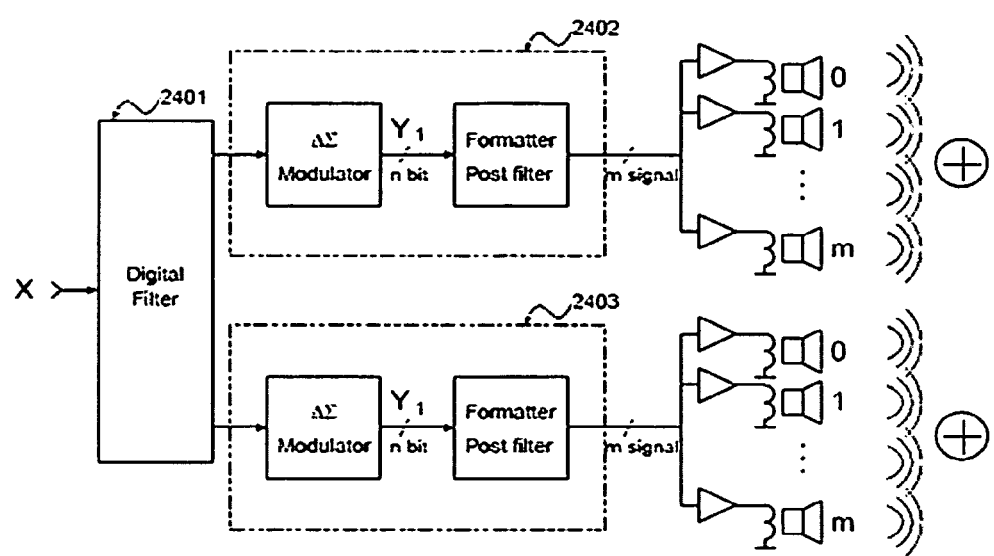
FIG. 24 is a structure diagram of an eighteenth example according to a preferred embodiment.

FIG. 24 shows a eighteenth example of a digital analog conversion apparatus as shown in one of the first to fourth examples, the digital analog conversion apparatus has a structure in which a digitally processed digital signal is converted to a stereo digital analog and has a plurality of channels, and it is applied to an application in which the sound pressure in a space is added using a plurality of drive devices as in the sixth example, the eighth example, and the tenth example. Here, a plurality of digital signals in which a frequency band is divided by a digital filter (2401) and a plurality of channels (2402), (2402) are digital analog conversion devices. For example, a digital signal is divided into a high frequency digital signal and a low frequency signal by the digital filter and it is possible to reproduce each signal by a speaker device optimized for a frequency band generated by digital processing under the arrangement of the digital analog conversion devices corresponding to the parallel channels.

Example Nineteen

Figure 25:
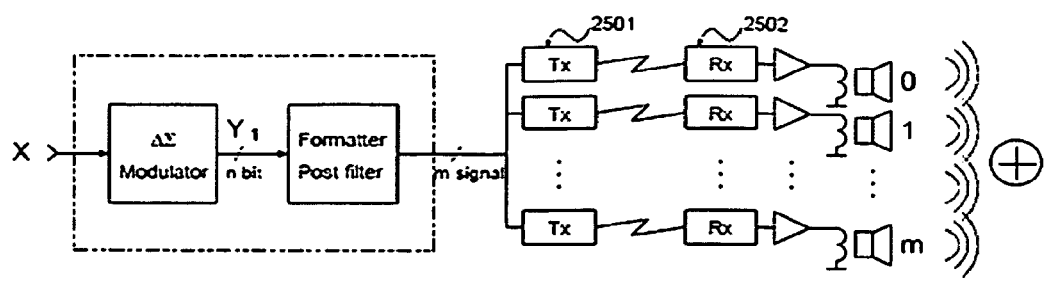
FIG. 25 is a structure diagram of a nineteenth example according to a preferred embodiment.

FIG. 25 shows a nineteenth example of a digital analog conversion apparatus as shown in one of the first to fourth examples in which a speaker is driven by a drive device after a signal which drives a drive device is firstly transmitted to a transmission channel by a digital signal transmitter (2501) and after being received by a digital signal reception device (2502) in an application in which the sound pressure in a space is added using a plurality of drive devices as in the sixth example, the eighth example, and the tenth example.

In this way, by transmitting a digital signal from a delta sigma modulator and a formatter by a digital signal transmission reception device, it is possible to transmit a signal which drives speakers having a dispersed arrangement as a digital transmission signal. Because the digital signal is over sampled by the delta sigma modulator, it is even possible to reduce any effects caused by errors in a transmission channel.

It is possible to use various transmission channels which digitally transmit such as a digital wired transmission channel, a wireless transmission channel or an optical transmission channel for the transmission channel.

In addition, while in an application to a noise reduction device a plurality of dispersed noise reduction speakers are required, in the present example it is possible to easily transmit drive data to separated sub-speakers using a digital transmission channel.

Example Twenty

Figure 26:
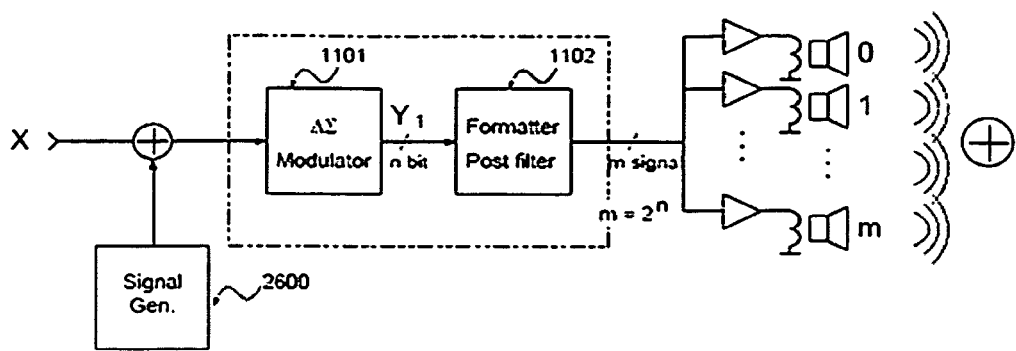
FIG. 26 is a structure diagram of a twentieth example according to a preferred embodiment.

FIG. 26 shows a twentieth example of a digital analog conversion apparatus as shown in one of the first to fourth examples in which an ultra-low frequency signal is superimposed on a signal which drives a drive device in an application in which the sound pressure is added in a space by using a plurality of drive devices as in the sixth example, in the eighth example, and the tenth example.

Generally, the audible frequency range is between 20-20K Hz and a sound below the lower limit frequency of 20 Hz is called an ultra-low frequency. If a sound in this band does not have an extremely large sound pressure, it is usually impossible for human ears to detect. However, its research on a possible relationship between health or mental stress is progressing.

In order to produce an ultra-low frequency using the conventional analog speakers it is necessary to drive the speakers at an extremely low signal and this causes significant power consumption problems because analog speakers have poor power efficiency. If the structure of the digital speaker of a preferred embodiment is used in order to produce an ultra-low frequency, it is possible to drive an electrical audio conversion element with a single bit signal, to reduce the effects of power efficiency, and furthermore to reduce the effects of nonlinearity of electrical audio conversion elements, and then to efficiently produce an ultra-low frequency signal.

Generally, because an ultra-low frequency signal in not included in a signal source (for example in a broadcast signal or in a recorded media), it is necessary to produce an ultra-low frequency signal using an ultra-low frequency generator (2600). It is preferable that the ultra-low frequency generator use a digital circuit (2600) to produce an arbitrary frequency pattern. For example, an ultra-low frequency signal having a fluctuation of 1/f can be easily produced if a digital circuit pseudorandom signal is used. Because the ultra-low frequency signal which is produced can easily be digitally added to a digital audio signal, it is possible to easily superimpose an ultra-low frequency signal.

Example Twenty-One

Figure 27A:
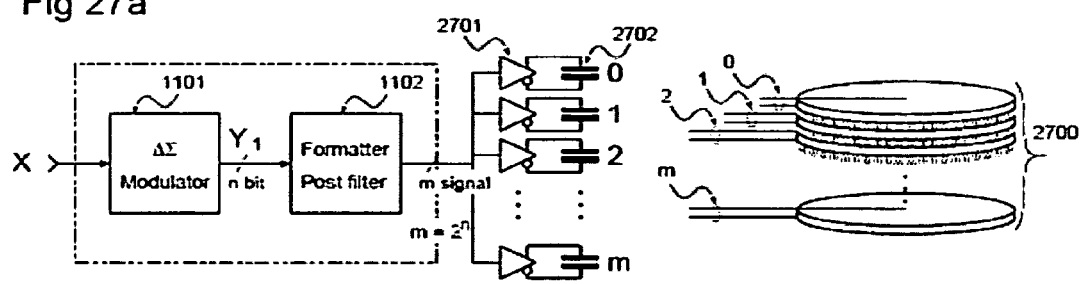
FIG. 27 is a structure diagram of a twenty-first example according to a preferred embodiment.
Figure 27B:
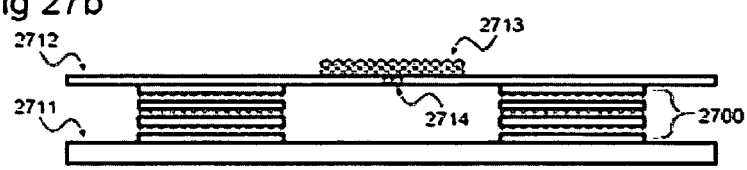
Figure 27C:
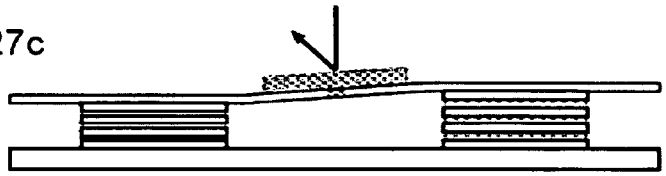

FIG. 27 shows a twenty-first example of a digital analog conversion apparatus as shown in one of the first to fourth examples in which a mirror is driven using a plurality of piezoelectric elements as in the eighth example, and the digital analog conversion apparatus is applied to an application in which the physical displacement is synthesized using a plurality of piezoelectric elements. In order to drive piezoelectric elements (2700) stacked as in FIG. 27a, a plurality of devices which drive the plurality of drive devices (2701) using a plurality of piezoelectric elements (2702) are arranged on a base (2711) as in FIG. 27b and connected to an upper part base (2712) so that a support part (2714) is on a fixed axis. A mirror (2713) is arranged on the upper part base. By transforming the upper part base (2712) by driving the piezoelectric elements (2700) and making the support part (2714) the center, it is possible to change the reflection angle of the mirror (2713). A device which has this combination of piezoelectric elements and a mirror can be applied to a small scale projector device. However, by driving by a digital analog conversion device and a plurality of piezoelectric elements, a reflection angle can be controlled by a digital single and therefore is suitable for a small scale projector.

Example Twenty-Two

Figure 28A:
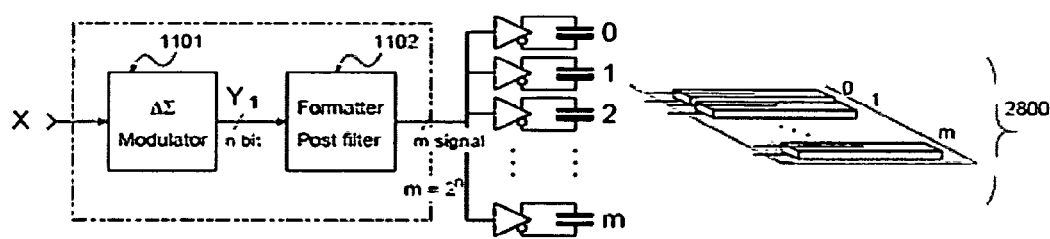
FIG. 28 is a structure diagram of a twenty-second example according to a preferred embodiment.
Figure 28B:
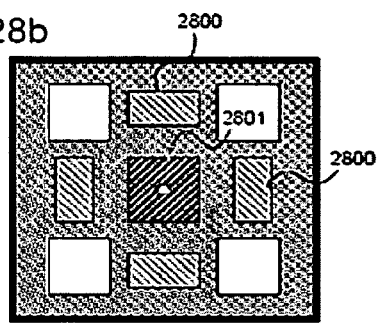

FIG. 28 shows a twenty-second example of a digital analog conversion apparatus as shown in one of the first to fourth examples in which a mirror is driven using a plurality of piezoelectric elements as in the eighth example, and the digital analog conversion apparatus is applied to an application in which the physical displacement is synthesized using a plurality of piezoelectric elements. A plurality of piezoelectric elements (2800) arranged in parallel on a substrate are used as in FIG. 28a. By arranging these piezoelectric elements (2800) along the XY axes around a mirror (2801) which is fixed in the center of the substrate and driving the piezoelectric elements (2800) and making the center of the support part a base point, it is possible to change the reflective angle of the mirror (2801). A device which combines this type of piezoelectric elements and a mirror can be applied to a small sized projector device. However, by driving by a digital analog conversion device and a plurality of piezoelectric elements arranged in parallel, a reflection angle can be controlled by a digital single and therefore is suitable for a thin, small scale projector.

Example Twenty-Three

Figure 29:
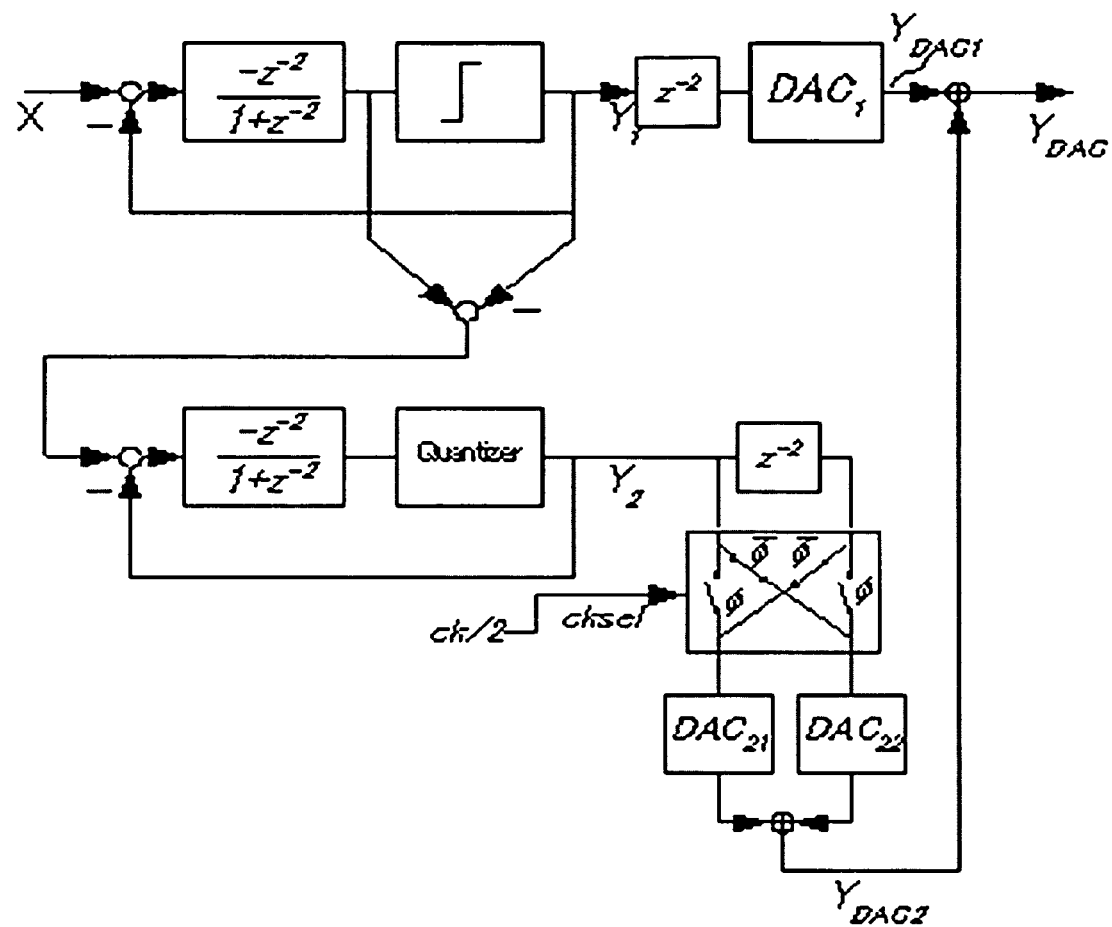
FIG. 29 is a structure diagram of a twenty-third example according to a preferred embodiment.

FIG. 29 shows a twenty-third example where a band-pass type delta sigma modulator is used as a cascade type delta sigma modulator of a digital analog conversion apparatus show in one of the first to fourth examples. Generally the band-pass type delta sigma modulator can be realized by converting $Z$ to $-Z^2$. By this conversion, an integrator is converted into a resonator. In this example, the output of a second stage internal delta sigma modulator is connected to a 2-clock delay device which realizes $Z^{-2}$ and connects a switch to the input and output of the delay device. This switch replaces a 2-input according to a signal of a frequency half of the clock frequency as shown in the diagram. By making this type of structure, even where there is a mismatch in the elements which form the DAC21 and DAC 22, it is possible to reduce noise in a frequency a quarter of that of the clock frequency.

As shown here, by converting a frequency, it is possible to realize band-pass characteristics and also arbitrary noise shaping characteristics.

Example Twenty-Four

Figure 30A:
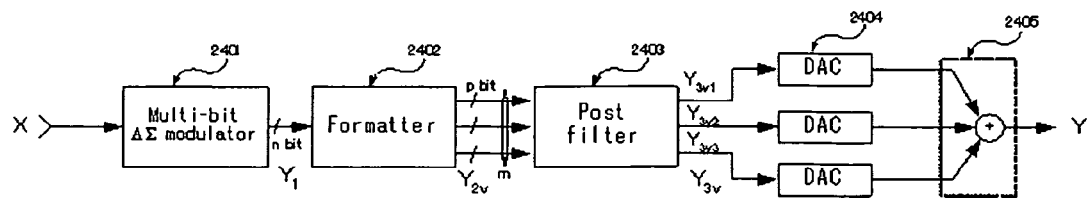
FIG. 30 is a structure diagram of a twenty-fourth example according to a preferred embodiment.

FIG. 30a shows a twenty-fourth example of a preferred embodiment. In the present example, a delta sigma modulator is assumed to have an output of n bits. A signal $Y_v$, which is generated by converting the output of n bits of a delta sigma modulator (2401) to an m group p-bit code by a formatter (2402), is processed by applying a mismatch shaping and a frequency selection by a post filter (2403) and that output is converted into an analog signal by an internal digital analog converter (2404) and added as an analog signal by an adder (2405). By this structure, it is possible to obtain a highly accurate analog signal even when a multi-level internal digital analog converter is used.

Figure 30B:
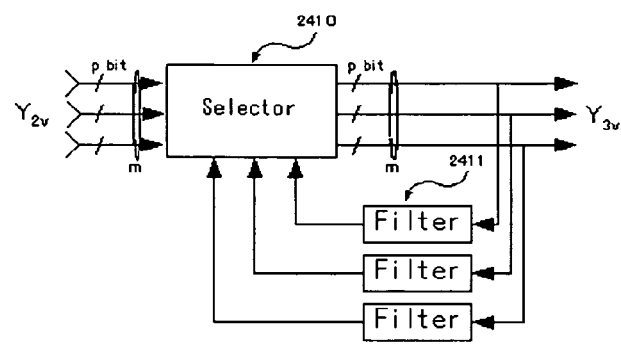

FIG. 30b shows an example of a post filter. In order to reduce a mismatch effect within the internal digital analog converter, a selection circuit (2410) operates so that the output of the selection circuit (2410) is selected according to the value of an output signal of a filter circuit (2411). Here, a filter calculation is performed in the filter on each output level of the digital analog converter. For example, an integrator or a device which connects a plurality of integrators is used as the filter, the selection is performed in order from the smallest filter output and by selecting so that an output is obtained which corresponds to an input signal by that selection, even when the output from the formatter is an output by a plurality of signals which represents a plurality of levels, it is possible to reduce noise in a low-frequency band by a mismatch.

Figure 30C:
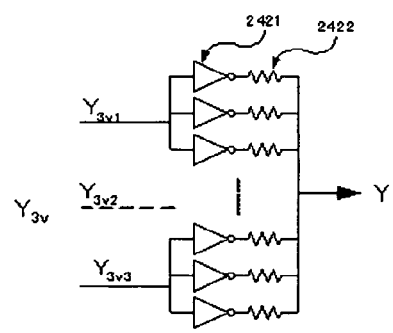

FIG. 30c shows a concrete example of a internal digital analog converter (2404) and an adder (2405). In this example, an analog current corresponding to each single bit signal is output by an inverter (2421) and a resistor (2422) and by connecting this plurality of currents the output current is added. In this example, the values which the plurality of internal digital analog converter input signals represent are not required to be the same and may have a different weight. In this case, the value of the resistor (2422) may be set according to a weight which each digital input signal represents. In addition, this weight is not limited to a weight of a power of 2. In the selector (2410), by selecting so that this selection result becomes equal to an input signal of the selector (2410), it is possible to accurately convert a signal even when a weight is different.

What is claimed is:

1. A digital speaker system comprising:
  a plurality of driver circuits;
  a speaker unit having a plurality of inputs and a corn driven by a plurality of voice coils, each of plurality of inputs corresponding to each of the plurality of voice coils and corresponding to each of plurality of the driver circuits;
  a delta sigma modulator to receive a digital audio signal and generate a first signal; and
  a mismatch shaper to convert the first signal to generate a second signal and output the second signal to the plurality of driver circuits which are selected according to a selection history of the plurality of driver circuits,
  wherein each of the plurality of driver circuits amplifies the second signal and generates three valued digital signals by using a switching driver, and
  wherein each of the plurality of inputs is supplied with three valued digital signals generated by a corresponding driver circuit among the plurality of driver circuits.

2. The digital speaker system according to claim 1 wherein the plurality of the voice coils are wound individually.

3. The digital speaker system according to claim 1 wherein the plurality of the voice coils are bunched and wound.

4. The digital speaker system according to claim 1, comprising:
  a delay circuit to delay the second signal and supply the plurality of the driver circuits with the delayed second signal.

5. The digital speaker system according to claim 1, comprising:
  a microphone unit; and
  a controller to receive a signal from the microphone unit and output a control signal to the delta sigma modulator.

6. The digital speaker system according to claim 5 wherein the microphone unit has a plurality of microphones.

7. The digital speaker system according to claim 6 wherein the microphone unit detects a direction of a peripheral noise.

8. The digital speaker system according to claim 1, comprising:
  a transmitter to transmit the second signal; and
  a receiver to receive the transmitted second signal and supply the plurality of the driver circuits with the received second signal.

9. A digital speaker system comprising:
  a first channel;
  a second channel; and
  a plurality of digital speakers, each of the plurality of digital speakers having a corn driven by a plurality of voice coils, and
  each of the first channel and the second channel including:
    a plurality of driver circuits,
    a delta sigma modulator to receive a digital audio signal and generate a first signal,
    a mismatch shaper to convert the first signal to generate a second signal and output the second signal to the plurality of driver circuits which are selected according to a selection history of the plurality of driver circuits,
  wherein each of the plurality of driver circuits amplifies the second signal and generates three valued digital signals by using a switching driver, and
  wherein a first group of the plurality of digital speakers among the plurality of digital speakers receives three valued digital signals from the first channel and a second group among the plurality of digital speakers receives three valued digital signals from the second channel.

10. The digital speaker system according to claim 9, comprising:
  a third channel wherein the first channel is a left channel, the second channel is a right channel, and the third channel is a center channel, and
  wherein a third group of the plurality of digital speakers among the plurality of digital speakers receives three valued digital signals from the third channel.

11. The digital speaker system according to claim 9, comprising:
  a third channel wherein a third group of the plurality of digital speakers among the plurality of digital speakers receives three valued digital signals from the first, second, or third channel.

12. The digital speaker system according to claim 10, wherein
  a speaker unit in the first channel and a speaker unit in the third channel are allocated dynamically and a speaker unit in the second channel and the speaker unit in the third channel are allocated dynamically.

* * * * *